(12) United States Patent
Pitwon

(10) Patent No.: US 9,325,146 B2
(45) Date of Patent: *Apr. 26, 2016

(54) AMPLIFICATION MODULE FOR AN OPTICAL PRINTED CIRCUIT BOARD AND AN OPTICAL PRINTED CIRCUIT BOARD

(75) Inventor: Richard C. A. Pitwon, Fareham (GB)

(73) Assignee: Xyratex Technology Limited, Havant (GB)

( * ) Notice: Subject to any disclaimer, the term of this patent is extended or adjusted under 35 U.S.C. 154(b) by 809 days.

This patent is subject to a terminal disclaimer.

(21) Appl. No.: 12/874,011

(22) Filed: Sep. 1, 2010

(65) Prior Publication Data

US 2012/0051688 A1 Mar. 1, 2012

(51) Int. Cl.
| | |
|---|---|
| H01S 3/091 | (2006.01) |
| H01S 3/063 | (2006.01) |
| H01S 3/0941 | (2006.01) |
| H01S 3/17 | (2006.01) |
| H01S 3/0933 | (2006.01) |
| H01S 3/094 | (2006.01) |
| H01S 3/16 | (2006.01) |
| H01S 3/23 | (2006.01) |
| H01S 5/40 | (2006.01) |
| H05K 1/02 | (2006.01) |
| H05K 1/14 | (2006.01) |
| G02B 6/12 | (2006.01) |
| G02B 6/122 | (2006.01) |

(52) U.S. Cl.
CPC .............. *H01S 3/091* (2013.01); *H01S 3/0637* (2013.01); *H01S 3/0941* (2013.01); *H01S 3/178* (2013.01); *H05K 1/0274* (2013.01); *G02B 6/12004* (2013.01); *G02B 6/1221* (2013.01); *H01S 3/0933* (2013.01); *H01S 3/094049* (2013.01); *H01S 3/1603* (2013.01); *H01S 3/1605* (2013.01); *H01S 3/1606* (2013.01); *H01S 3/168* (2013.01); *H01S 3/2308* (2013.01); *H01S 3/2383* (2013.01); *H01S 5/4031* (2013.01); *H05K 1/142* (2013.01); *H05K 2201/044* (2013.01)

(58) Field of Classification Search
None
See application file for complete search history.

(56) References Cited

U.S. PATENT DOCUMENTS

| 4,955,685 A | | 9/1990 | Garman | |
|---|---|---|---|---|
| 5,291,503 A | * | 3/1994 | Geiger et al. | ................... 372/21 |

(Continued)

OTHER PUBLICATIONS

Michael J. Lochhead et al., "Rare-Earth Clustering and Aluminum Codoping in Sol-Gel Silica: Investigation Using Europium (III) Fluorescence Spectroscopy," Chem. Mater., vol. 7, No. 3, pp. 572-577 (1995).

(Continued)

*Primary Examiner* — John M Bedtelyon
(74) *Attorney, Agent, or Firm* — Mueting, Raasch & Gebhardt, P.A.

(57) ABSTRACT

The invention provides an amplification module for an optical printed circuit board, the optical printed circuit board comprising plural polymer waveguide sections from independent waveguides, each of the sections being doped with an amplifying dopant, wherein the plural waveguide sections are routed so as to pass through an amplification zone in which the plural polymer waveguide sections are arranged close or adjacent to one another, the amplification module comprising: a pump source comprising plural light sources arranged to provide independently controllable levels of pump radiation to each of the plural waveguide sections. In an embodiment, the amplification module also includes plural polymer waveguide sections corresponding to the plural polymer waveguides of the printed circuit board on which in use the amplification module is to be arranged, each of the sections being doped with an amplifying dopant.

28 Claims, 37 Drawing Sheets

(56) References Cited

U.S. PATENT DOCUMENTS

| | | | |
|---|---|---|---|
| 6,603,917 B2* | 8/2003 | Takayama et al. | 385/129 |
| 6,947,208 B2 | 9/2005 | Ballato et al. | |
| 7,068,420 B2* | 6/2006 | Tallone et al. | 359/333 |
| 7,206,124 B2* | 4/2007 | Park et al. | 359/341.32 |
| 7,362,496 B2 | 4/2008 | Boretz et al. | |
| 7,440,171 B2* | 10/2008 | Liu et al. | 359/337.3 |
| 8,488,920 B2* | 7/2013 | Pitwon | 385/14 |
| 2004/0062512 A1* | 4/2004 | Pawlowski et al. | 385/141 |
| 2005/0088723 A1 | 4/2005 | Kawazoe et al. | |
| 2005/0152427 A1* | 7/2005 | Shin et al. | 372/70 |
| 2006/0012853 A1 | 1/2006 | Tallone et al. | |

OTHER PUBLICATIONS

S. Moynihan et al., "Optical properties of planar polymer waveguides doped with organo-lanthanide complexes," Optical Materials, vol. 29, pp. 1821-1830 (2007).

Shuhei Fujimoto et al., "Near Infrared Light Amplification in Dye-Doped Polymer Waveguide," Jpn. J. Appl. Phys., vol. 45, Abstract (2006).

A.J. Heeger, "Conjugated Polymers and Related Materials," http://en.wikipedia.org/wiki/Organic_LED-cite_ref-33, in W. R. Salaneck, I. Lundstrom, B. Ranby, pp. 27-62. ISBN 0198557299, Oxford 1993.

R. Kiebooms et al., "Synthesis, Electrical, and Optical Properties of Conjugated Polymers," Handbook of Advanced Electronic and Photonic Materials and Devices, vol. 8, pp. 1-86 (2001).

Richard Pitwon, "Design and implementation of an electro-optical backplane with pluggable in-plane connectors," SPIE Photonics West—OPTO Paper: Opto 7607-18, pp. 1-30, San Francisco, Jan. 26, 2010.

U.S. Office Action dated Nov. 27, 2013 in corresponding U.S. Appl. No. 13/840,095.

U.S. Office Action dated Jun. 11, 2014 in corresponding U.S. Appl. No. 13/840,095.

* cited by examiner

Back-reflection feedback tap with optical circulator

Electroluminescent self-pumping waveguide

AMPLIFICATION MODULE FOR AN OPTICAL PRINTED CIRCUIT BOARD AND AN OPTICAL PRINTED CIRCUIT BOARD

The present invention relates to an amplification module for an optical printed circuit board and an optical printed circuit board. As used herein the term "optical PCB" refers to a printed circuit board that includes one or more optical layers. Typically it will also include one or more metal layers and a PCB support layer such as FR4.

As the sizes of optical printed circuit boards increase, there is a need to compensate for the absorption of the optical signals conveyed along the embedded waveguides by the material of which those waveguides are comprised, the optical losses at the ingress and egress waveguide coupling interfaces due to surface roughness scattering and Fresnel effects, and optical losses due to scattering by the side walls of the waveguides. In particular, waveguides composed of polymer are generally more absorbent of light at certain optical frequencies commonly used in data communication, compared to glass fibres.

This signal absorption can be mitigated by providing correspondingly higher powered optical signals along waveguides on the PCBs. One way to achieve this is to increase the power of the signals as they are generated; in other words, provide more powerful light sources. However, this will give rise to an increase in power consumption of the light source and power density and there are limits to how powerful an input signal can be made without introducing distortion or degrading the signal in other ways.

As optical "super backplanes" (optical PCBs used as backplanes in large scale data storage systems, which may be provided as modular backplanes) become more widely used, the need to enable an optical signal in a PCB to travel larger distances and therefore require high power at generation, will increase correspondingly.

In our co-pending patent application number U.S. Ser. No. 12/785,931 filed 24 May 2010, the entire contents of which are hereby incorporated by reference, there is disclosed a modular optical PCB. FIG. 1A shows a schematic representation of an optical PCB as disclosed in U.S. Ser. No. 12/785,931, the optical PCB comprising three separate component PCBs $1_1$, $1_2$ and $1_3$. In this example, the component PCBs $1_1$ to $1_3$ are arranged for connection by movement in a single direction, i.e. in the direction of the axis XX'. The component circuit boards $1_1$ to $1_3$ comprise electrical connectors 3 which are typically provided for low speed control signals and possibly also data signals. In addition, high-speed optical connectors 5 are provided on the component circuit boards in such a way as to enable optical signals to be transmitted between the respective pairs of adjacent component circuit boards $1_1$ to $1_3$.

In some embodiments disclosed in U.S. Ser. No. 12/785,931, the modular PCB is in the form of modular backplane provided for arrangement within the housing of a storage system. By providing a modular PCB backplane, the difficulties associated with manufacturing a single large PCB are avoided. In addition, the use of optical waveguides within the modular PCB backplane ensures that the problems associated with electrical connection and signal propagation across a large electrical PCB are avoided. However, the larger the overall size of the PCB, i.e. the greater the number of modular component PCBs assembled into the main PCB, the longer the distances that optical signals have to travel from source to destination.

An alternative or additional means to using higher powered input signals is to use some form of amplification of a signal as it passes along the optical channel in the PCB. Optical fibre amplifiers are well known. They have been used for some time on fibres such as silica fibres (which are made up of a silica matrix), to allow transmission of optical signals over long distance (1000s of kilometers) without intermediary opto-electronic and electro-optic conversion. This has been achieved by doping certain segments of the fibres, known as active regions, with lanthanides. Examples of dopant materials used include neodymium and praseodymium, which have emission bands around 1300 nm and erbium which has an emission band around 1550 nm.

The presence of lanthanides allows the active region to be optically pumped to generate a population inversion in its electron states, i.e. a higher proportion of dopant atoms or molecules are in an excited state than in their normal lower energy state. This satisfies the condition for stimulated emission whereby an incoming signal photon interacts with the excited atom and the latter's excited electron falls to a lower energy state while emitting a photon with the same energy (wavelength) and phase and in the same direction as the original photon. This gives rise to an amplification of incoming optical signals through the active region. This is also the dominant mechanism on which laser (light amplification by stimulated emission of radiation) operation is based, except that lasers have optical cavities where light is contained within the active region by mirrors, one of which is only partially reflecting, thus enabling the light to escape along a controlled trajectory.

A disadvantage of silica is that the achievable concentration of dopants in the silica matrix is quite low, typically about 0.1 mol %. Higher doping concentrations give rise to the phenomenon known as rare earth ion clustering as described by Lochhead in "Rare-Earth Clustering and Aluminum Codoping in Sol-Gel Silica: Investigation Using Europium (III) Fluorescence Spectroscopy", Chem. Mater., 1995, 7 (3), pp 572-577. This has a detrimental effect on the photoluminescence, i.e. the ability of a substance to absorb and subsequently reemit a photon. Therefore active regions in silica fibres need to be very long in order to provide effective amplification. Certain polymers on the other hand lend themselves to much higher doping concentrations and therefore the active regions can be significantly shorter to enable practical deployment on an optical PCB. Suitable polymers include polyacrylates (e.g. poly(methyl methacrylate), polystyrene, polycarbonate and polysiloxane.

Research has been carried out on a variety of polymer doping schemes to enable optical amplification by polymer waveguides. One such example is described in the article entitled "Optical Properties of Planar Polymer Waveguides Doped with Organo-Lanthanide Complexes" Science Direct Optical Materials 29 (2007) pp. 1821-1830 by Moynihan, S. et al. There is disclosed the fabrication of thin film optical polymer sheets doped with organo-lanthanide dopants. This demonstrates optical fluorescence in the visible and near-infrared required for amplification. Another such example is described in the article entitled "Near Infrared Light Amplification in Dye-Doped Polymer Waveguide" Japanese Journal Applied Physics 45 (2006) pp. L355-L357, by Fujimoto, S. et al. The entire contents of both of these articles is hereby incorporated by reference.

The lanthanide ions $Tb^{3+}$ (Terbium), $Dy^{3+}$ (Dysprosium), $Eu^{3+}$ (Europium) and $Sm^{3+}$ (Samarium) fluoresce in the wavelength band of 550 nm-650 nm, which is close to the polymer transmission window of 850 nm. Appropriate complexes of these lanthanides could be devised which push the fluorescence band into the polymer transmission window. Moynihan et al describes how doped polymer may be created by stirring the dopant material into the liquid polymer for a day to achieve the required concentration.

US-A-2006/0012853 discloses an optical amplifier including a substrate having disposed thereon an optical waveguide, the optical waveguide having an active region with Si nanocrystals dispersed in an erbium doped glass matrix. A light is arranged to irradiate the doped waveguide with pump electromagnetic radiation. The amplifier also includes means for suitably shaping an input electromagnetic field to be amplified into the active region of the optical waveguide.

In our co-pending patent application entitled "An Optical PCB and A Method of Making an Optical PCB", there is disclosed the idea of an amplification zone or node in which plural doped waveguides are brought together within a relatively close proximity to enable a common pump source to be used to amplify signals in each of the plural waveguides. This system works well. However, in some specific applications a greater degree of control of signal properties on the optical PCB is required.

According to a first aspect of the present invention, there is provided an amplification module for an optical printed circuit board, the optical printed circuit board comprising plural polymer waveguide sections from independent waveguides, each of the sections being doped with an amplifying dopant, wherein the plural waveguide sections are routed so as to pass through an amplification zone in which the plural polymer waveguide sections are arranged close or adjacent to one another, the amplification module comprising: a pump source comprising plural light sources arranged to provide independently controllable levels of pump radiation to each or different ones of the plural waveguide sections.

The invention describes low cost devices to enable the on-board amplification of optical signals propagating along polymer waveguides embedded in an optical PCB. These devices comprise controllable light sources to provide pumping of the doped polymer optical waveguides in designated regions known as amplification nodes, where many waveguides are aggregated. The invention includes waveguide selectable amplification techniques, which allow different waveguides to be amplified to different degrees in order to compensate for and balance out the varying losses incurred on different waveguides. The pump radiation provided can be independently controlled for individual ones or individual groups forming subsets of the total number of waveguide sections.

In an embodiment, each of the plural light sources comprises one or more light emitting sources arranged to irradiate light onto only a selected one of the plural waveguide sections.

In an embodiment, each of the plural light sources comprises a row of light emitting diodes.

In an embodiment the amplification module comprises a diffuser to diffuse light emitted from the pump source.

In an embodiment, the diffuser comprises a translucent layer.

In an embodiment, the amplification module comprises a rod lens to focus light from the pump source onto a respective one or more of the plural waveguide sections.

In an embodiment the amplification module comprises plural lenses each arranged to focus light from a selected subset of the light sources onto a corresponding region of the plural waveguide sections.

In an embodiment, the lenses are selected from the group consisting of geometric lenses and graded index lenses. It will be appreciated that any suitable form of lens can be used.

In an embodiment, the amplification module comprises a feedback control arranged to detect a signal strength of an optical signal input to or output from the or each of the plural polymer waveguide sections and to control the amplification provided thereto in dependence thereon. Thus, a module is provided by which the output power from or the input power to the active polymer waveguide sections can be determined and modified if required to ensure that the signals to be sent from the active polymer waveguides have the desired or required signal strength. The feedback control can be provided by any desired means and various non-limiting examples are described herein below, including mirrored cleaved surfaces or regions of different refractive index controlled to split off a proportion of an input or output signal and to route the split-off signal to a detector such as a photodetector so as to enable a determination of the signal strength.

According to a second aspect of the present invention, there is provided an amplification module for provision in an opening on an optical printed circuit board, the optical printed circuit board comprising plural waveguides, the amplification module, comprising: plural waveguide sections corresponding to the plural waveguides of the printed circuit board on which in use the amplification module is to be arranged, each of the sections being doped with an amplifying dopant; a pump source comprising plural light sources arranged to provide independently controllable levels of pump radiation to each of the doped plural waveguide sections.

An amplification module is provided that includes active waveguide regions, i.e. regions of doped polymer waveguides that, when pumped appropriately can serve to amplify optically signals passing though them. By providing the amplification module with the active waveguide regions the module can be used on an entirely passive optical printed circuit board such as a backplane or midplane in a storage system. It will be appreciated that the waveguides incorporated on the amplification module can be of any suitable form. Polymer waveguides are preferred but other possibilities include standard silica, which are preferably coiled to increase the length within the module.

Preferably, each of the plural light sources comprises one or more light emitting sources arranged to irradiate light onto only a selected one of the plural waveguide sections. This enables selective amplification of individual waveguides to be easily achieved and controlled.

In an embodiment, each of the plural light sources comprises a row of light emitting diodes. Thus, low-cost and easy to manufacture components can be used in the amplification module.

Preferably, the module comprises a diffuser to diffuse light emitted from the pump source. This ensures that the waveguide or waveguide region being pumped can be "covered" uniformly with the pumping radiation. In particular, this means that all the dopant in the waveguide region is effectively utilised.

In an embodiment, the diffuser comprises a translucent layer, however any type of optical diffuser, which can diffuse light of the appropriate pump radiation wavelength can be used. Typical optical diffusers use different methods to diffuse light and can include ground glass diffusers, teflon diffusers, holographic diffusers, opal glass diffusers, and greyed glass diffusers.

In one embodiment, a rod lens is provided to focus light from the pump source onto a respective one or more of the plural waveguide sections. Thus, a means is provided for ensuring that all light output from the pump source which might typically comprise plural UV LEDs which give out light as a diverging beam, is focused onto the active or doped region of the waveguide.

In one embodiment, the plural polymer waveguide sections have lengths and or patterns of dopant concentration corresponding to the required amplification. In other words, if greater amplification is required a greater length of doped waveguide can be provided as part of the amplification module. Alternatively or in addition, if the pattern of pump radiation is not uniform and some regions of the doped waveguide are expected to receive a greater amount of pump radiation than others, the dopant concentration profile of the waveguide can be adjusted to match this.

In an embodiment, the module comprises plural lenses each arranged to focus light from a selected subset of the light sources onto a corresponding region of the plural waveguide sections. The lenses are, preferably, selected from the group consisting of geometric lenses, which include spherical lenses and rod lenses and graded index lenses.

According to a third aspect of the present invention, there is provided an electro-optical printed circuit board, comprising plural waveguides arranged thereon for transfer of data and/or signals, wherein the plural waveguides are routed so as to pass through or approach an amplification zone in which plural polymer waveguide sections are arranged close or adjacent to one another, the electro-optical printed circuit board comprising at least one amplification module according to the first or second aspects of the present invention.

The use of one or more amplification modules and nodes according to embodiments of the present invention provide an effective and robust means by which an electro-optic circuit board can be provided without problems curtailing the utility. In particular, by providing an optical PCB with an amplification module the signal strength can be controlled and it is thus possible to ensure that the required signal strengths are achieved to allow signals to propagate along the waveguides over the required distances on the PCB.

Furthermore, the ability to vary the amplification on a waveguide-by-waveguide basis means that the optical PCB can be used in many diverse areas, as described below. It might be that signals in one waveguide within an amplification node need very little whereas signals in another waveguide within the node need significant amplification. The present system provides a simple and robust mechanism by which this can be achieved.

According to a fourth aspect of the present invention, there is provided a data storage system, comprising a midplane for connection of plural data storage devices and being for connection to one or more hosts, the midplane being an electro-optical printed circuit board according to the third aspect of the present invention.

In an embodiment, the data storage system comprises a light-pipe in optical communication with one or more of the amplification modules to provide optical pump radiation to the amplification nodes. This is particularly advantageous as it enables the midplane to be entirely passive as far as the optical amplification modules are concerned. The active pumping is provided from the source which is typically remote, i.e. provided on an external part of the housing of the data storage system, to which the user has easy access.

According to a fifth aspect of the present invention, there is provided an amplifying polymer waveguide, the waveguide comprising: an active region including electroluminescent polymer material, in which the electroluminescent polymer material is doped with one or more optical amplifying materials; and electrical contacts to provide a voltage to the active region to generate optical radiation within the electroluminescent polymer material and thereby pump the one or more optical amplifying materials. There are disclosed herein plural examples of materials that could be used as the electroluminescent polymer material and/or the one or more optical amplifying materials.

Preferably, the amplifying polymer waveguide is formed on a substrate and there are also formed or arranged on the substrate electrical contacts to provide electrical power to the waveguide and thereby generate pump radiation. Since the amplifying material is actually provided within the electroluminescent polymer material, i.e. it may be suspended in the polymer matrix, the radiation generated upon application of a voltage is received extremely efficiently by the amplifying material.

In one preferred example the waveguide is made up of a cured electroluminescent polymer material which was originally liquid, the amplifying material being suspended in the uncured liquid prior to forming thus enabling a uniform or desired controlled distribution of the amplifying material to be achieved.

According to a sixth aspect of the present invention, there is provided an amplifying polymer waveguide, the waveguide comprising: a region including electroluminescent polymer material; an active waveguide region, in which the active waveguide region comprises a core polymer material doped with one or more optical amplifying materials; and electrical contacts to provide a voltage to the electroluminescent polymer material to generate optical radiation within the electroluminescent polymer material and thereby pump the one or more optical amplifying materials.

In one example, it is the active waveguide region that includes the electroluminescent polymer material. In other words the active region can be formed at least partially of electroluminescent polymer material, which material would be doped with one or more amplifying materials. This is a particularly efficient example since the pump light is actually generated within the doped region.

In one embodiment, the waveguide has at least one cladding layer and it is the at least one cladding layer that includes the electroluminescent polymer material. In other words, in this example, the waveguide core is provided as normal to include a region doped with amplifying materials. The cladding of the waveguide is then formed from electroluminescent polymer material. The electroluminescent polymer material is selected so as to have a lower refractive index than the doped core so that it can perform a waveguiding function well.

Preferably, the upper cladding of the waveguide is formed of an electroluminescent polymer material. By forming the upper cladding from electroluminescent polymer material, pumping can easily and conveniently be achieved. Ready access is available to the material for pumping electrodes.

In a preferred embodiment, the electrical contacts are formed on the surface of the upper cladding. Preferably, the electrical contacts substantially cover the upper cladding and serve to reflect light generated in the electroluminescent polymer material into the waveguide core. Thus, the electrical contacts can be provided as a metal layer on the upper surface of the waveguide. This has two synergistic effects. First, the conductive surface can of course provide the function of an electrode by which the electroluminescent polymer material can be provided with electrical power. Second, the metal layer acts as a reflector or concentrator to direct light generated in the electroluminescent polymer material into the doped waveguide core within the waveguide structure.

It will be understood that preferably the waveguide of the sixth aspect of the present invention can be provided in an amplification module of either of the first and second aspects of the present invention.

Embodiments of the present invention will now be described in detail with reference to the accompanying drawings, in which:

FIG. 1A shows a schematic representation of an optical PCB as disclosed in U.S. Ser. No. 12/785,931;

Figure 1A:
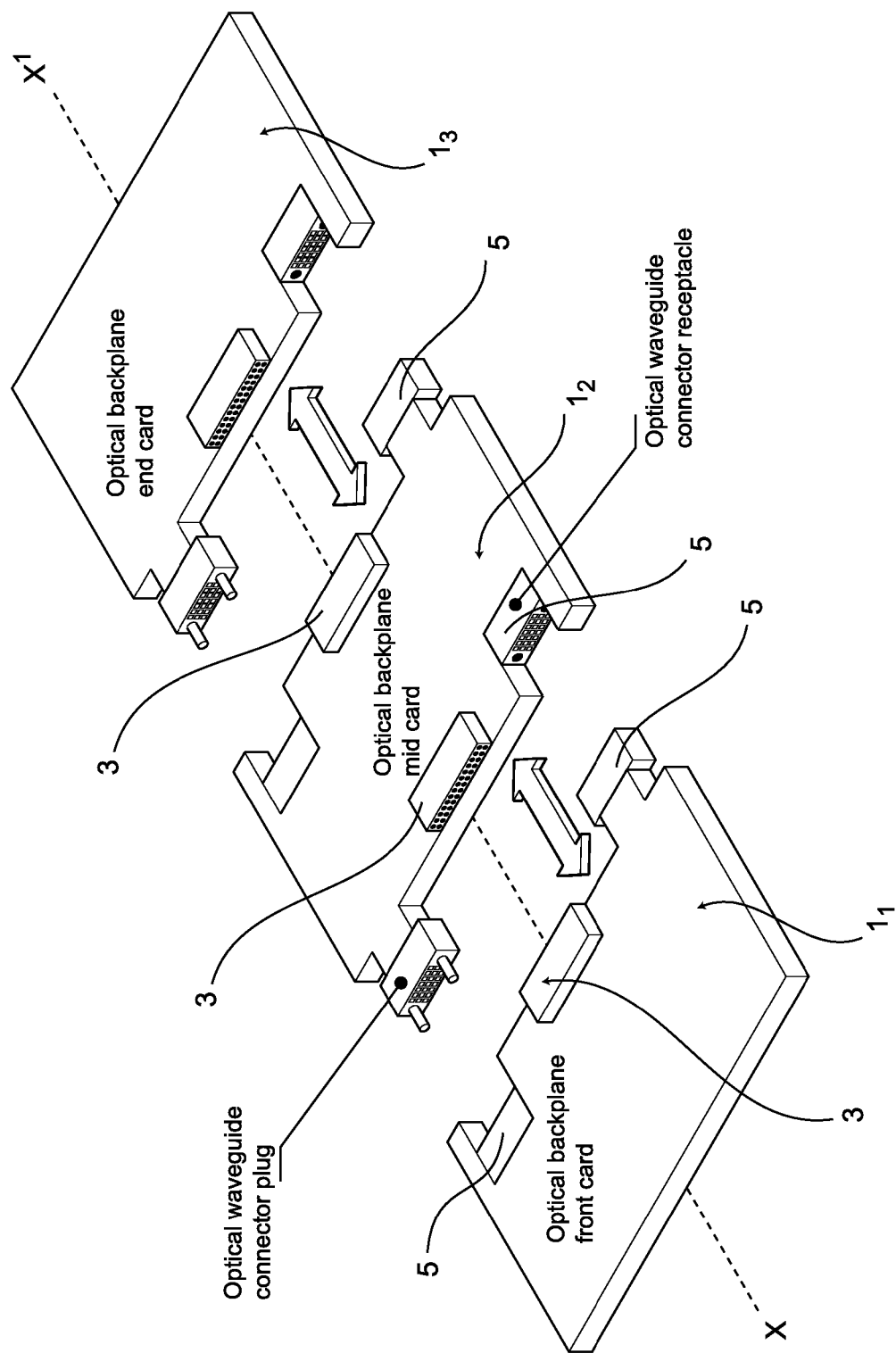
FIG. 1 shows a schematic representation of an amplification node on an optical PCB.
Figure 1:
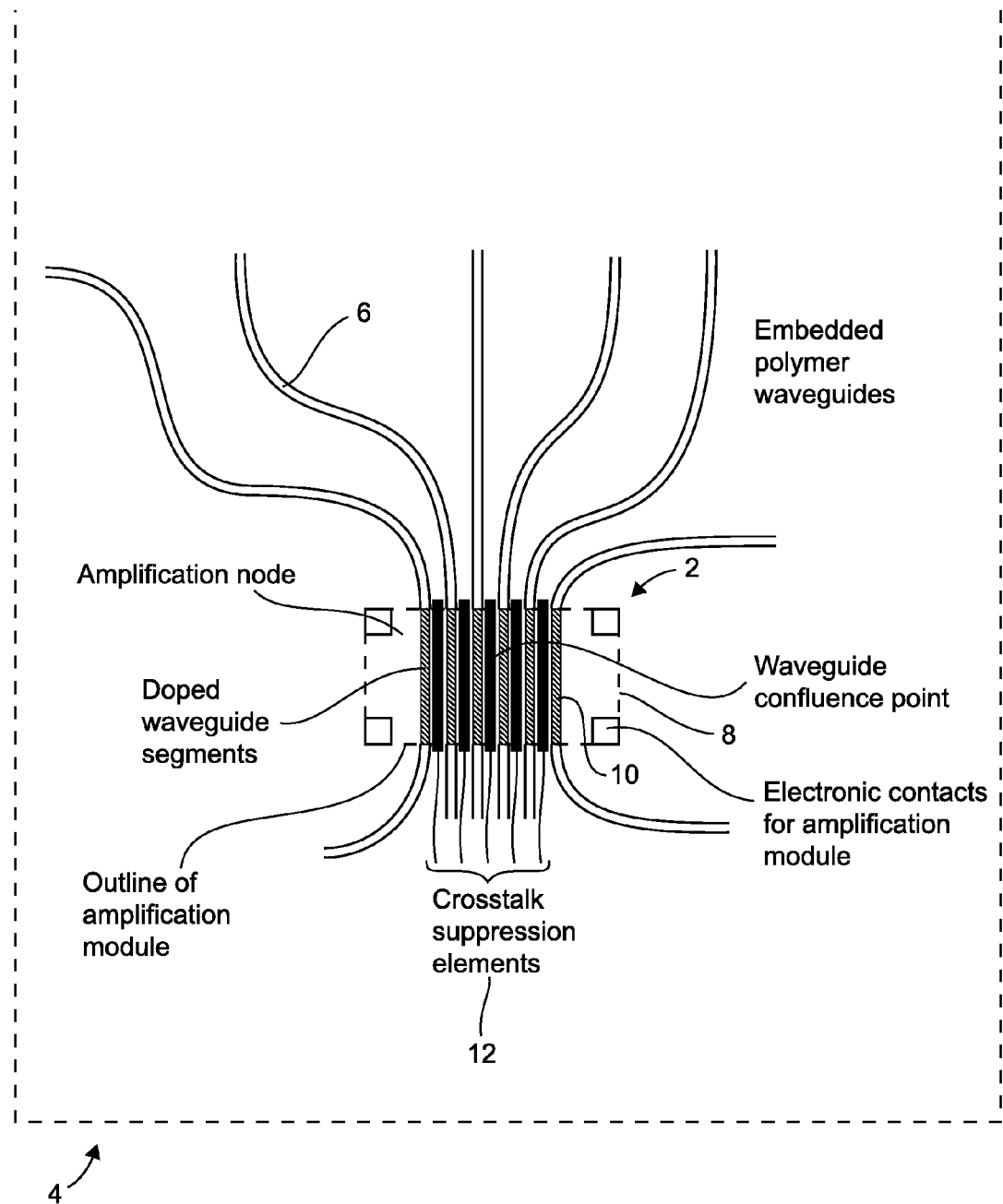

FIG. 1 shows a schematic representation of an amplification node 2 provided on an optical PCB 4. The amplification node 2 is a region where plural active waveguide segments are brought "close" together so as to enable pumping of plural waveguides in a small region of the PCB as opposed to over the whole of the PCB 4. This is described in greater detail in our co-pending application filed concurrently herewith and having attorney's references number P16675US and entitled "An Optical PCB and A Method of Making an Optical PCB". The entire contents of this disclosure are hereby incorporated by reference.

The PCB comprises plural waveguides 6 arranged to pass through a region 8 referred to as the amplification node 2. Within the node 2, regions 10 of each of the waveguides are doped with an amplifying dopant. Crosstalk suppression elements 12 are provided between each of the waveguide sections 10 within the amplification node 2 to suppress crosstalk between individual ones of each pair of waveguide sections 10.

Figure 2:
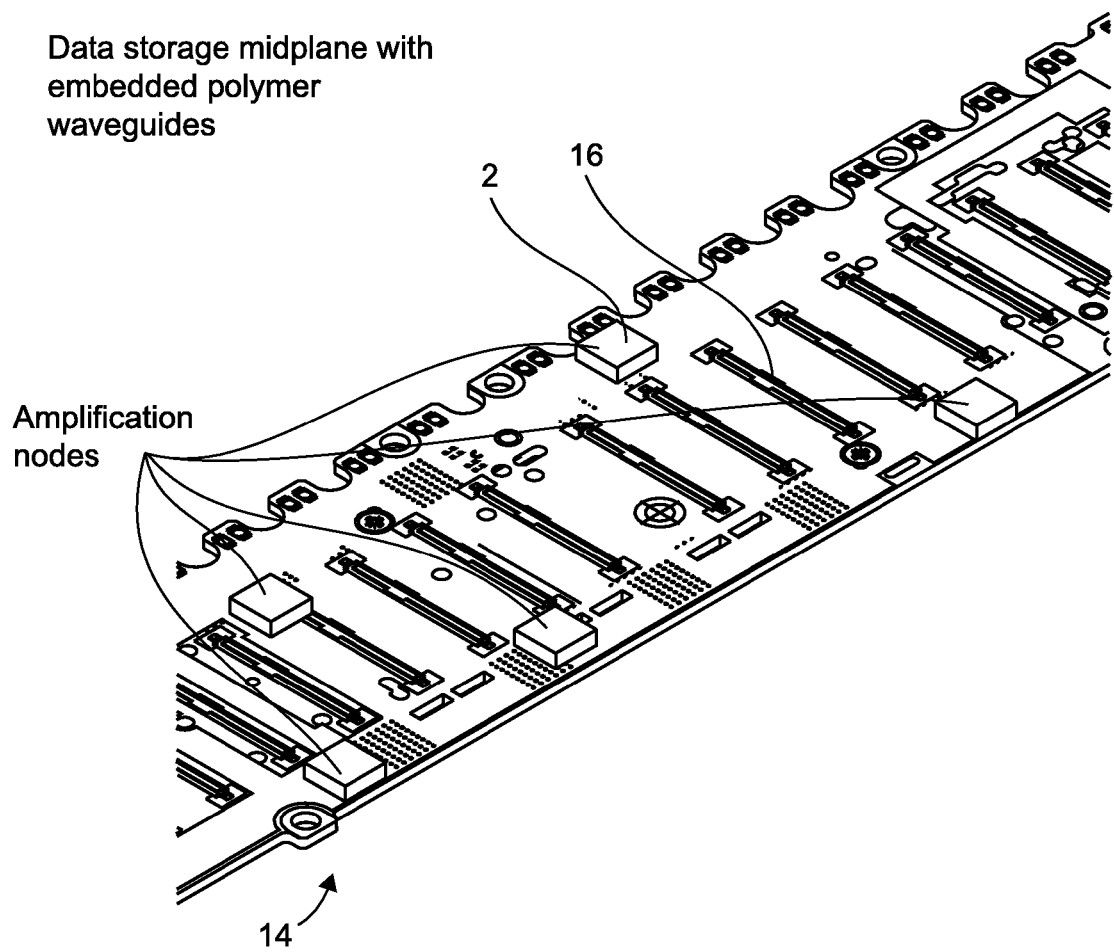
FIG. 2 shows a schematic representation of a data storage midplane with embedded polymer waveguides.

FIG. 2 is a schematic representation of a data storage midplane 14. Sockets 16 are provided, each for receiving a user circuit such as a hard disk drive (not shown). On the reverse side of the midplane (also not shown) connectors are provided for connecting the midplane to one or more hosts for communication with the disk drives connected to the slots 16. Amplification nodes 2 are provided on the midplane. The amplification nodes 2 are distributed in an appropriate manner. In order to minimise cost, as many waveguides as possible would pass through a single amplification node. However, it is desirable that modifications to the waveguide layout be moderate and do not lead to dramatic deviations in the course of a given waveguide. Therefore, it is preferred that a midplane such as that shown in FIG. 2 would be provided with plural amplification nodes distributed at convenient locations across the board in such a way as to minimise deviation of waveguides on the midplane 14.

Figure 3:
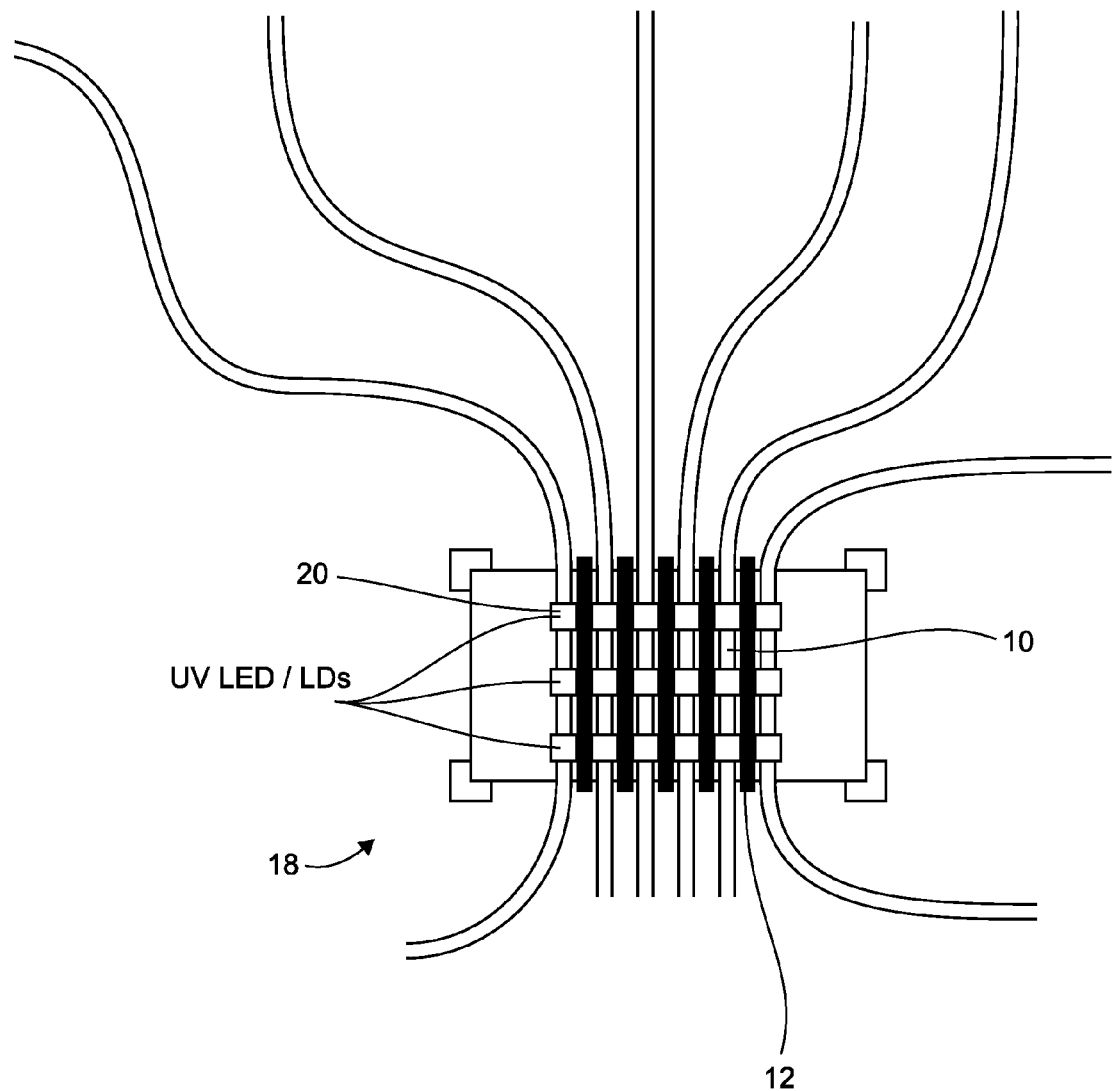
FIG. 3 is a schematic representation of an amplification module (plan view)

FIG. 3 shows a schematic representation of an amplification module 18, which, in this example, would be provided over the amplification node 2. The module 18 includes plural light sources 20 which serve to provide pump radiation for the waveguide sections 10 provided as part of the node. The optical pump source is an important part of the amplification module as it serves to irradiate the active region of the waveguides in order to generate the required population inversion in the electron states of the dopants. It is the population inversion that allows amplification to occur through stimulated emission of incoming signal photons.

The pump wavelength is shorter than the emission wavelength, i.e. the pump photons have a higher energy than the emission photons as some radiation-less decay in the electronic states typically occurs after excitation. As an example, the pump wavelength of the lanthanide ions $Tb^{3+}$ (Terbium), $Dy^{3+}$ (Dysprosium), $Eu^{3+}$ (Europium) and $Sm^{3+}$ (Samarium) are 368 nm, 365 nm, 395 nm and 402 nm respectively while they emit at 545 nm, 573 nm, 613 nm and 643 nm respectively. The lanthanide complexes described in the Moynihan article referred to above require a pump wavelength of 350 nm. Light Emitting Diodes (LEDs) are now commonly available which emit in the required excitation bands. For example, the UV LEDs provided by Fox Group Electronics emit at about 350 nm.

It is preferred that the amplification module is arranged to straddle the amplification node and comprises one or an array of UV LEDs or laser diodes, or indeed any appropriate pump radiation source, to provide pump radiation. Preferably the pump radiation is provided orthogonally to the plane of the active waveguide areas within the amplification node 2.

As will be described below, the amplification module is preferably electrically connected to an electric layer of the electro-optical PCB through leads or stud bumps. If the optical layer is on the surface between the amplification module and the electrical contacts, e.g. the top surface, then clearance in the optical layer will be designed to allow access of the amplification module's contacts to the contact lands on the electrical layer. If the optical layer is not a surface layer, but embedded in the board, then clearance in the layers above the amplification node is provided to enable optical access by the amplification module housed on the surface.

Referring again to FIG. 3, the amplification module 18 is provided and houses a 2D array of light sources 20 arranged, in use, to straddle the amplification node so as to be able to provide pump radiation to all the active waveguide regions within the amplification node. The light sources are connected to electronic contacts from which power and control signals can be drawn.

Figure 4:
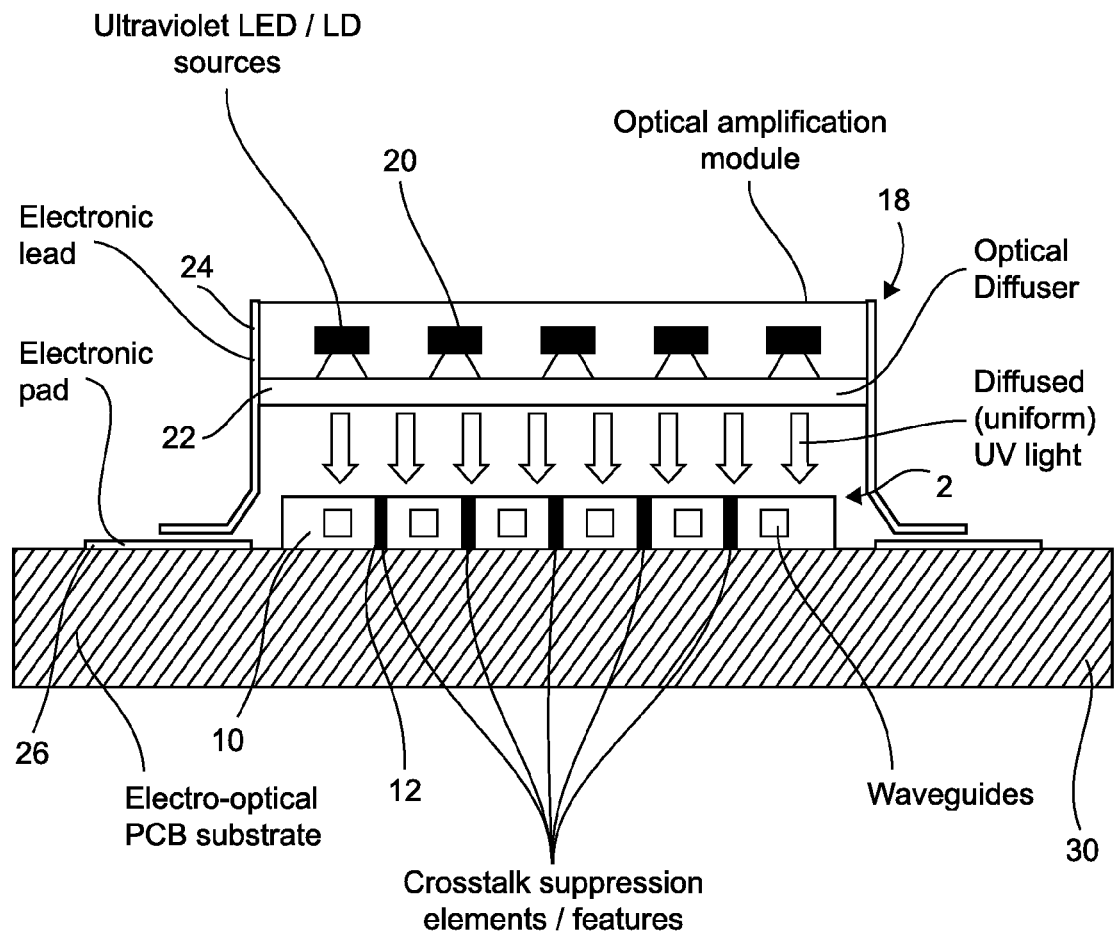
FIG. 4 is a schematic representation of a section through the module of FIG. 3.

FIG. 4 shows a vertical cross section through an example of an amplification module. The amplification module 18 is arranged to be provided to straddle the waveguides 10 and crosstalk suppression elements 12 which define the amplification node 2. As shown, the waveguides comprise a core material surrounded by an optical cladding material. In some embodiments, to be described in detail below, the amplification module itself includes active doped waveguide regions which take up a position within an appropriately sized and shaped opening in the underlying PCB when the amplification module is placed on a PCB.

In the present non-limiting example, the module 18 comprises plural light sources 20 and an optical diffuser 22. The light sources could be original sources, such as LEDs or, alternatively lenses or other such components arranged to provide light from an original source. The diffuser 22 serves to ensure that light is uniformly distributed across the node 2 or module 18. Electrical connectors 24 are provided as part of the amplification module in this example. The connectors 24 are arranged to contact electronic pads 26 provided on an upper surface of the substrate 30 of the device. The electronic leads 24 provide power and control signals to the optical sources 20. As will be explained below, the optical sources 20 are preferably controlled so as to operate individually or in subdivided groups of more than one so as to provide control over the intensity distribution of pump light across the node 2 and even across individual waveguides.

The light sources 20 are positioned to emit down towards the PCB through a diffusing layer 22 such that the pump radiation reaching all parts of the active waveguide regions forming a node 2 is substantially uniform. It will be appreciated that although localised light sources are shown and described, i.e. active components such as UV LEDs etc, remote light sources could be provided as well as or instead of the localised light sources. In other words, pump light could be conveyed from a remote amplification module, say on the external chassis of the system where it would be user accessible, by means of one or more light pipes into the amplification node. Furthermore the or each light pipe conveying pump radiation to a given amplification node could be subdivided into distinct constituent light pipes dedicated to individual waveguides to allow waveguide selective amplification even from a remote amplification module. As there is typically a mechanical limit on how small or thin such light pipes could be made, they would preferably have beam shapers on the end of them such as rod lenses to focus the light into a given waveguide. These beam shapers could either be discrete components such as rod lenses mounted on the ends of the light pipe or, preferably, molded or otherwise shaped components on the end of the light pipe itself. In other words, in a preferred embodiment, the lenses are integral with the light pipe.

Figure 5:
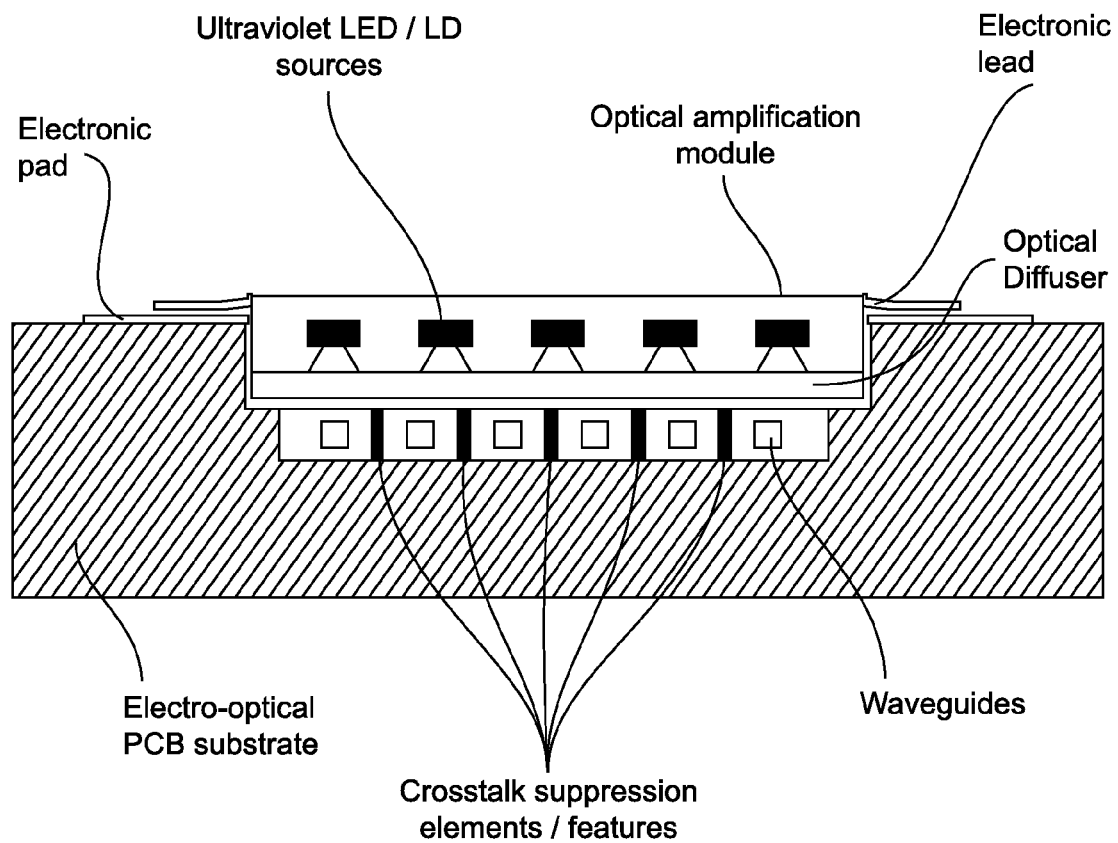
FIG. 5 is a schematic representation of an amplification module.

FIG. 5 shows a similar module to that of FIG. 4. However, in the case of FIG. 5 the module is arranged to be mounted within a suitably sized recess on an optical PCB. The uppermost surface of the module is substantially flush with the uppermost surface of the PCB. This is pertinent to the case where the optical layer is arranged on an internal and not a surface layer of the PCB.

In practice, waveguide lengths, routes and attenuation profiles on an optical PCB would typically vary, possibly significantly, from waveguide to waveguide. The inventor has therefore recognised that it may be desirable to control the amount of amplification on any particular waveguide in a selectable manner. In other words it might be desirable to provide a greater degree of amplification to signals in one waveguide than to another. This would be especially useful if signal strength output from the board were needed to be balanced for performance or health and safety purposes. For example, a uniform blanket amplification on a batch of waveguides at an amplification node carrying signals over a large range of signal powers, could give rise to some signal strengths being much higher than others. It might not, for instance, be possible to amplify the weakest signal in a given waveguide batch up to an acceptable signal recovery threshold without pushing, say, the strongest signal in the same batch beyond a health and safety threshold, e.g. beyond the prescribed laser classification of an optical PCB system.

There are various ways that control can be applied to an amplification module. In a first embodiment, selective enablement or disablement of optical sources is provided. Given the presence of a diffusion layer 22 which will serve to average out the optical power distribution, coarse control of the amount of pump light reaching a certain waveguide can be achieved by selectively enabling or disabling certain of the optical sources 20. One way that this can be achieved is by the provision of independent power supply or supplies to the pump light sources.

In one example, the module 18 is arranged to include an "enable control input" which serves to activate or deactivate all the pump sources together depending on its state. In a preferred embodiment, the module includes multiple enable control inputs which separately control subsets of all of the optical sources, e.g. the strips or banks of LEDs. The module in one embodiment includes multiple enable control inputs, which separately control individual subsets. If the number of pump light sources on a given amplification module is sufficiently large then it is preferred that the module be programmed using, for example, a parallel address interface or serial interface. One possible example of such a system would utilise a shift register or Two Wire interface (TWI)

In another more preferred embodiment, control of optical output from individual sources is enabled. In other words, instead of disabling or enabling certain light sources to provide the required average localised output, the output power of an individual light source is varied by varying the drive current or power supply to it. Thus, a high level of amplification control over individual waveguides would thus be achieved. This would be achievable through the use of, for example, a programmable interface.

In a preferred embodiment, the diffusion layer on the amplification module is separated into strips which are aligned to individual waveguides so as to provide uniform pump radiation along the active length of the waveguide. As explained above, typical optical diffusers use different methods to diffuse light. Any suitable diffuser could be used, examples including ground glass, diffusers, teflon diffusers, holographic diffusers, opal glass diffusers, and greyed glass diffusers.

Figure 6:
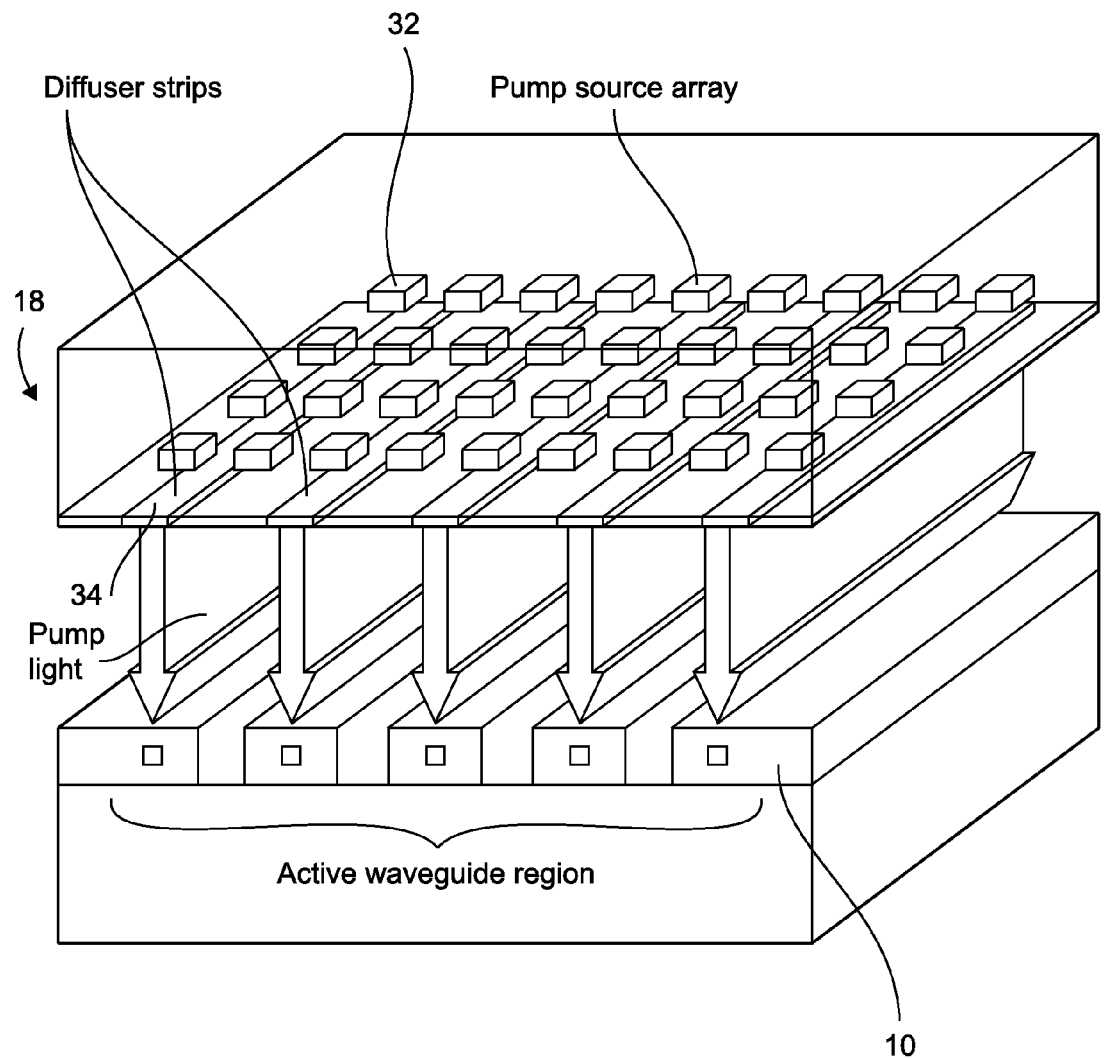
FIG. 6 is a schematic perspective view of an amplification module.

Referring to FIG. 6, the amplification module 18 comprises plural light sources 32 in the form of individual LEDs. Instead of a uniform diffuser layer, diffuser strips 34 are provided which are arranged to be in alignment with the waveguides 10 forming the amplification node on the PCB substrate. Thus, the diffusion layer is separated into, or made up of, strips which are aligned to individual waveguides and therefore provide uniform pump radiation along the active length of the waveguide. The pump sources 32 can be selectively dimmed or disabled to provide the required amplification on each of the individual waveguides.

Figure 7:
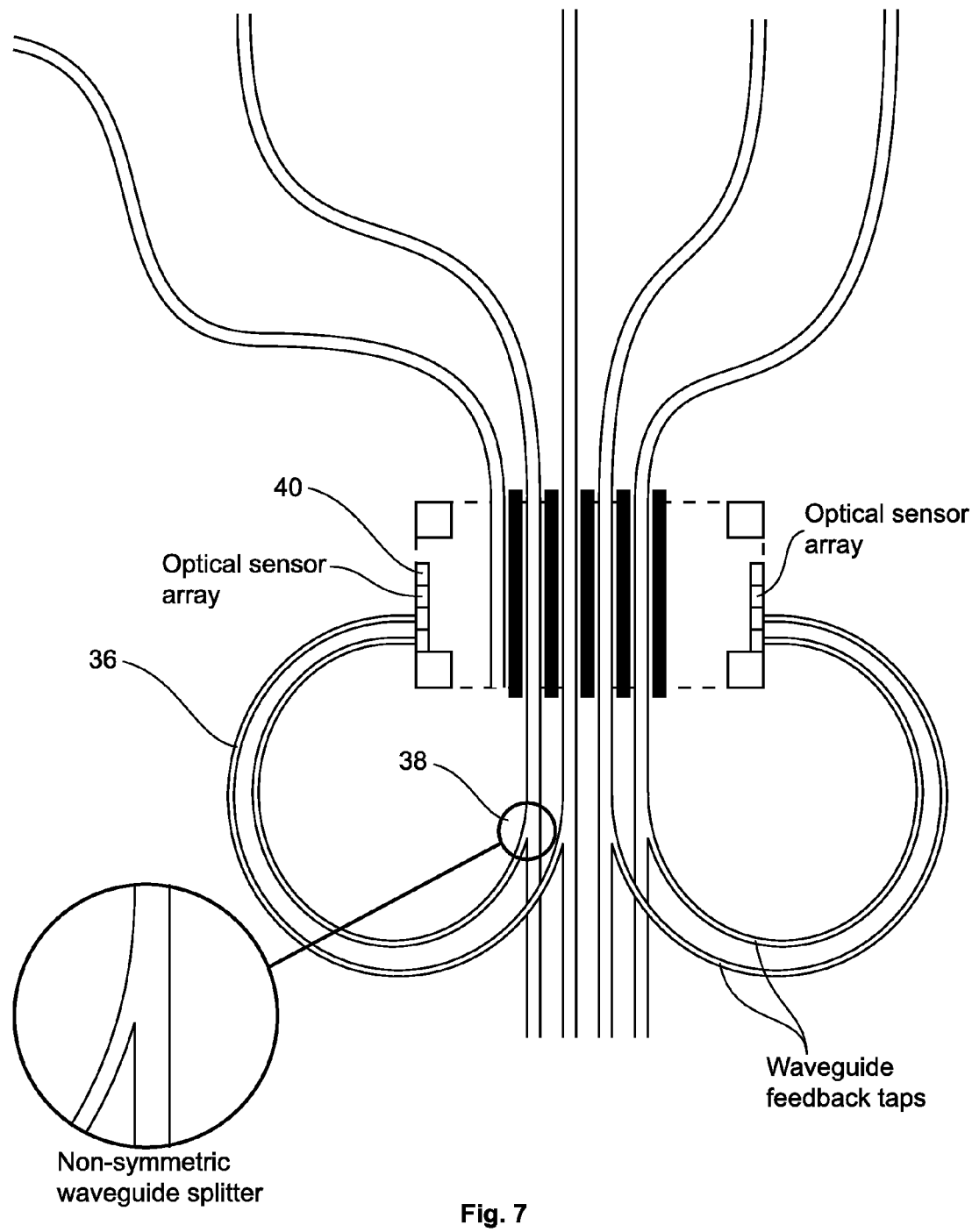
FIG. 7 is a schematic representation of an amplification module including feedback loops.

FIG. 7 shows a further embodiment of an amplification module. In this example, a control mechanism is provided in the form of an automated feedback process, by which the amplification module is able to monitor a portion of the amplified signal. The arrangement of FIG. 7 includes a feedback waveguide 36. A splitter 38 is provided and arranged to channel a proportion, typically a small proportion less than 50%, such as between 5% and 25% of the output signal (or input signal) from (or to) the amplification node to an optical sensor 40. The optical sensor 40 serves to detect the magnitude of the signal along the feedback waveguide 36 and can then be used to generate an input signal to a control (not shown) to either increase or decrease the amplification of the particular waveguide. Furthermore, by providing a feedback mechanism on each of the waveguides within the amplification node it is possible to use the obtained feedback data to accurately control the signal level (e.g. by controlling the amplification) on each of the waveguides as it "leaves" the node. Such an arrangement is particularly suitable for applications requiring tight restrictions on optical signal strength or those in which the optical signal strength on the waveguide is expected to vary during typical operation. For example if the optical waveguides were disposed entirely or in part on a flexible element which during operation could be flexed to different degrees, than the signal strength of the waveguide would differ depending on how strongly or to what extent the flexible element was flexed or otherwise deformed. This optical feedback arrangement would allow the signal strength to be adjusted dynamically as the configuration of the waveguide changed thus immediately compensating for the change in signal strength. One example of such an application would be a portable computer, in which the flexible circuitry between one moveable portion and the other moveable portion would be flexed to different degrees depending on the angle between them, e.g. if the portable computer screen was in an open or closed state. Another example would be a clamshell mobile phone, palm pilot or any portable computing device involving moveable parts.

A non-symmetric waveguide splitter is preferably used and serves to tap off a small fraction (less than half and preferably less than a quarter) of the optical signal power. This is used as opposed to a symmetric splitter which would split the signal power equally between both branches.

An alternative means for providing the waveguide selectable amplification enables a control system to effectively be avoided. The alternative method requires that the active waveguide segments within the amplification node are of different lengths based on the predicted amount of amplification required on a given waveguide. It is possible to predict accurately the losses incurred on a waveguide based on factors including any or all of length, number of bends, angles subtended by given bends, bend radii, refractive index between core and cladding, number of crossings, crossing angles and side wall roughness. Therefore it is possible to determine for any particular waveguide on an optical PCB how much amplification will be required in the or each amplification node through which it passes. Using this information, the length of waveguide that is actually doped within the amplification node and/or the amount of pump radiation provided by an associated amplification module, or indeed the concentration of the dopant, can be varied between waveguides so as to provide the waveguide selectable amplification.

Figure 35:
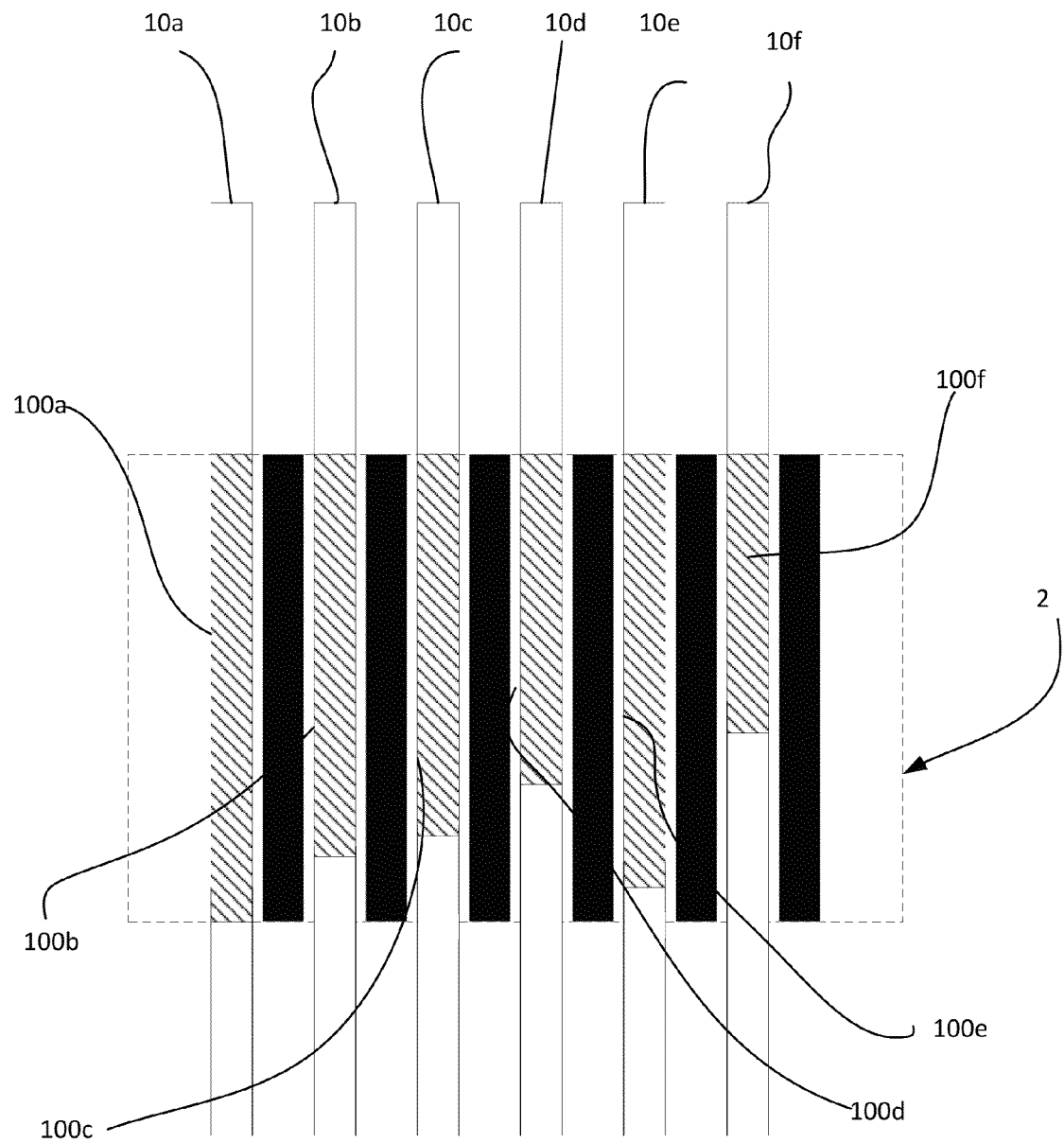
FIG. 35 is a schematic representation of an amplification node including active segments having different lengths.

FIG. 35 depicts an amplification node 2 having six (6), for example, waveguides 10*a*, 10*b*, 10*c*, 10*d*, 10*e*, and 10*f* with active segments brought close together. The plural independent waveguides each have active segments 100*a*, 100*b*, 100*c*, 100*d*, 100*e*, and 100*f* that have different lengths, as seen in FIG. 35.

In one embodiment, instead of using different lengths of active waveguide segments, a blocking material is provided over the part, e.g. the top part, of a given waveguide which therefore serves to block pumping light to a required length of active segment. In other words, some means of blocking the pump radiation and stopping it reaching the doped waveguide is provided. Alternatively, an absorbing diffuser can be used and the degree of absorption controlled so as to ensure that a desired amount of pump radiation impinges upon the active waveguide beneath.

Such an arrangement would find particular utility on a rigid optical PCB whereby the waveguide shapes, structures and losses are not expected to change during normal operation. Many applications require flexible optical waveguides, e.g. polymer waveguides on flexible laminate, which flex during operation. For example in mobile telephones or portable computers it is expected that flexible polymeric optical circuits may be used. Waveguide losses in such systems would change dynamically depending on the waveguide's configuration and would require a feedback amplification control system such as that shown in FIG. 7. In addition, optical polymers can degrade over time and a dynamic amplification control system would help significantly extend their useful performance period.

In one embodiment, the amplification module including the pump sources for providing independently controllable levels of pump radiation to various waveguide sections, also includes active doped regions which can be used within an amplification node as described above. In other words, the active doped waveguides are incorporated onto the amplification module instead of being part of the node on the PCB. This therefore enables the PCB itself to be a passive waveguide network and thus, more straightforward to manufacture.

Figure 8:
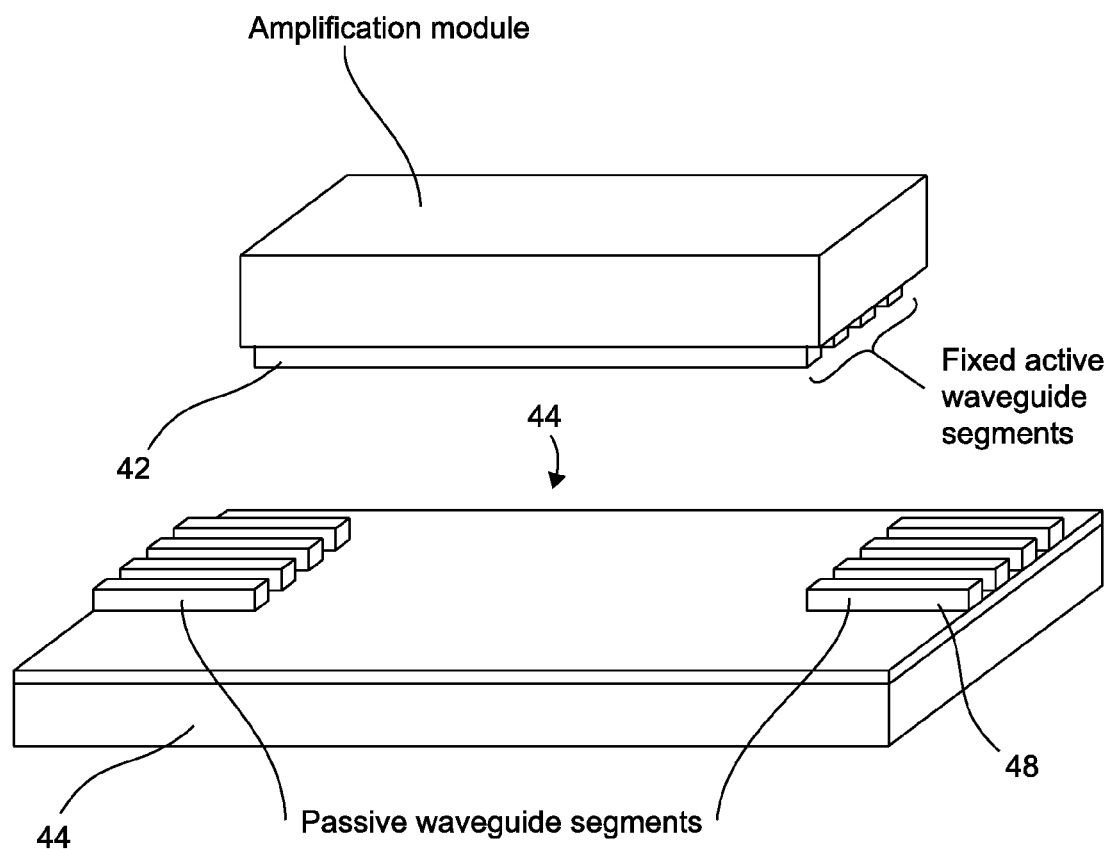
FIG. 8 is a schematic representation of a replaceable amplification module.
Figure 9:
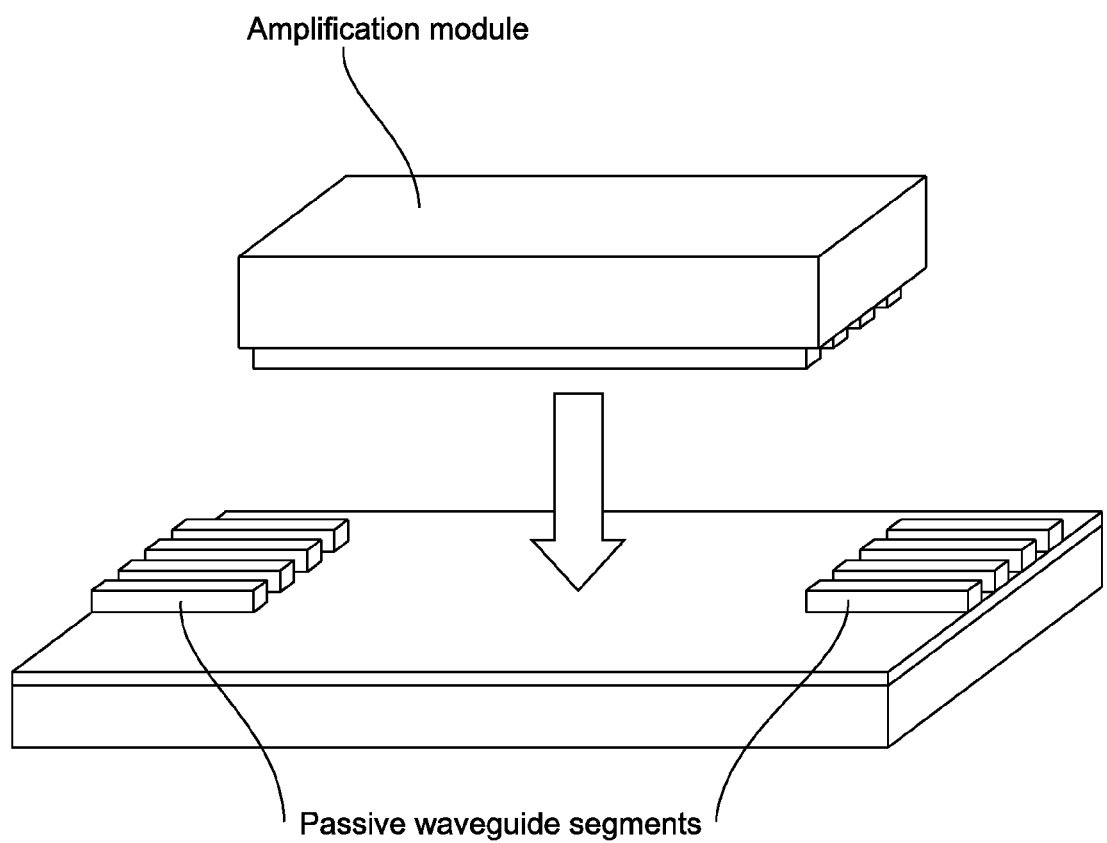
FIG. 9 is a schematic representation of a replaceable amplification module.
Figure 10:
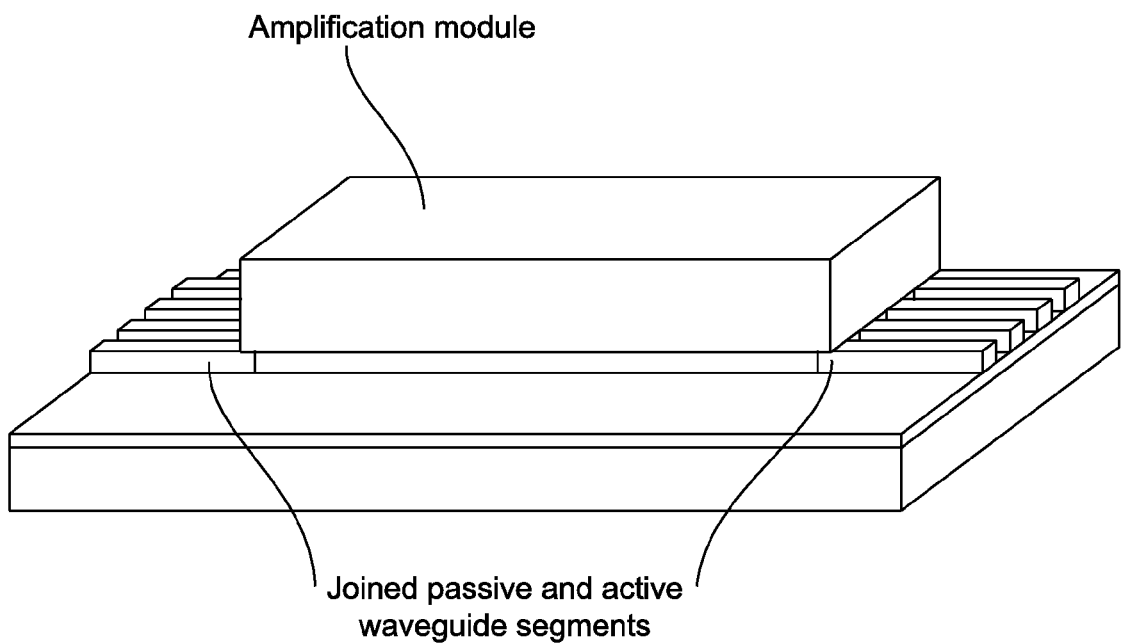
FIG. 10 is a schematic representation of a replaceable amplification module arranged on an optical PCB.

FIG. 8 shows a schematic representation of an amplification module that includes active waveguide segments. As used herein, the terms "active" and "passive" when referring to waveguides are used to denote doped and undoped waveguides, respectively. In FIG. 8, the amplification module comprises fixed active waveguide segments 42 sized and arranged to fill in gaps 44 within an amplification node on a passive undoped optical PCB 46. In other words, passive undoped waveguide segments 48 are formed on the PCB 46 with openings 44 for receiving active doped segments 42 formed together with the amplification module. FIGS. 9 and 10 show the steps of arrangement of the amplification module together with the fixed active waveguide segments into the opening 44 on the PCB 46.

Figure 36:
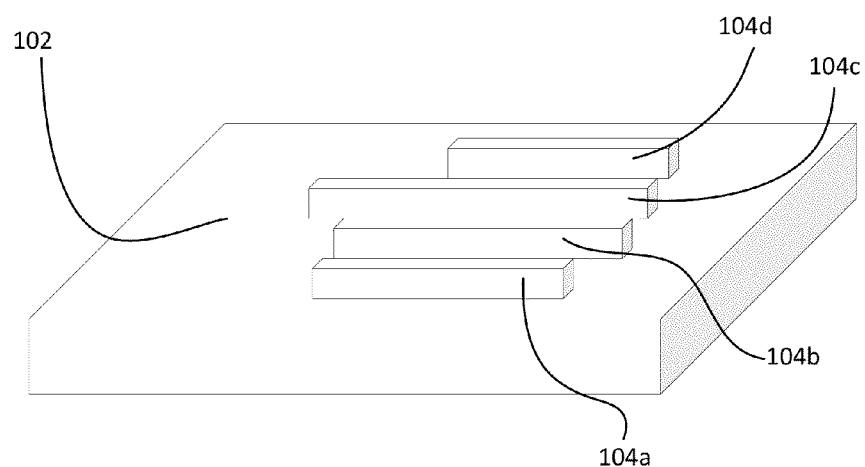
FIG. 36 is a schematic representation of an amplification module including active segments having different lengths.
Figure 36:
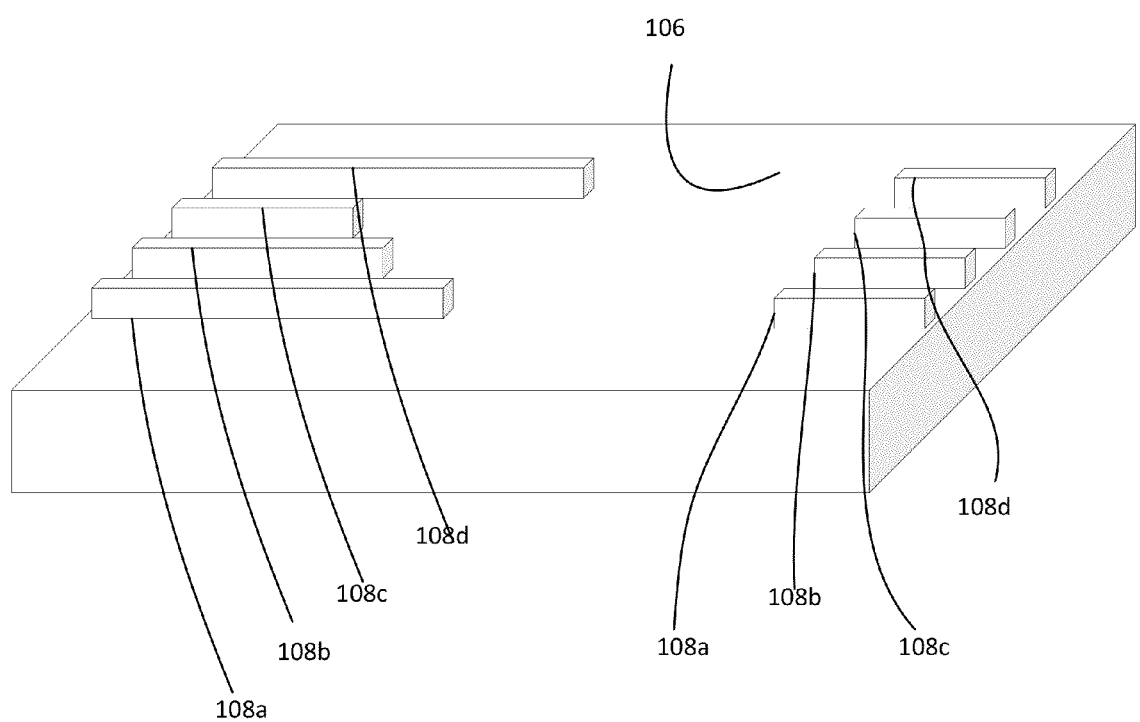

FIG. 36 depicts an amplification module 102. It should be noted that the amplification module 102 is flipped over so that the surface that would be in contact with the optical PCB 106 can be seen. The amplification module 102 includes active segments 104*a*, 104*b*, 104*c*, and 104*d* that have different lengths. The optical PCB 106 can then include polymer waveguides 108*a*, 108*b*, 108*c*, and 108*d* that can be configured to receive the active segments.

In a preferred embodiment, the active waveguides mounted on the amplification module are made up of silica. This has benefits in that pump radiation can accelerate degradation of polymer waveguides and therefore providing the active segments as silica means that there would be no accelerated degradation due to the pump radiation.

When an amplification module is provided on a PCB, it is important that the active waveguide segments 42 align with the passive waveguide segments 48 formed on the PCB 46. One way by which this alignment can be achieved is with the fabrication of alignment features in the cladding on the PCB 46.

Figure 11:
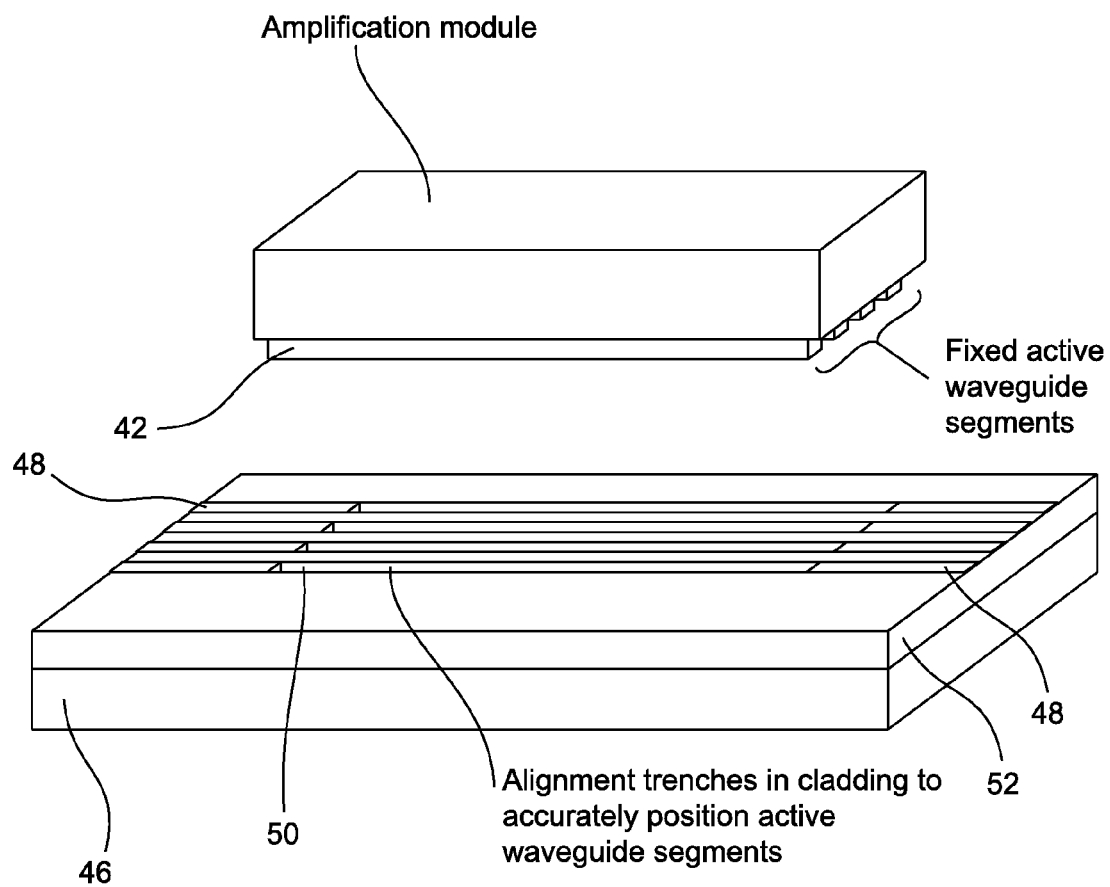
FIGS. 11 to 13 show stages of arrangement of an amplification module within an opening on an optical PCB.

FIG. 11 shows one preferred means by which this is achieved. As can be seen, trenches 50 are formed in the cladding material 52. The trenches 50 serve as a mechanical registration datum to align and accommodate the active waveguide segments 42 of the amplification module within the amplification node. When the amplification module is brought into position, the active, i.e. doped, waveguides first engage with the compliant board features, i.e. the trenches 50, and once they are fully accommodated and the active waveguides on the amplification module are aligned with the passive waveguides on the PCB, electronic connections between the amplification module and the PCB 46 can be formed.

Figure 12:
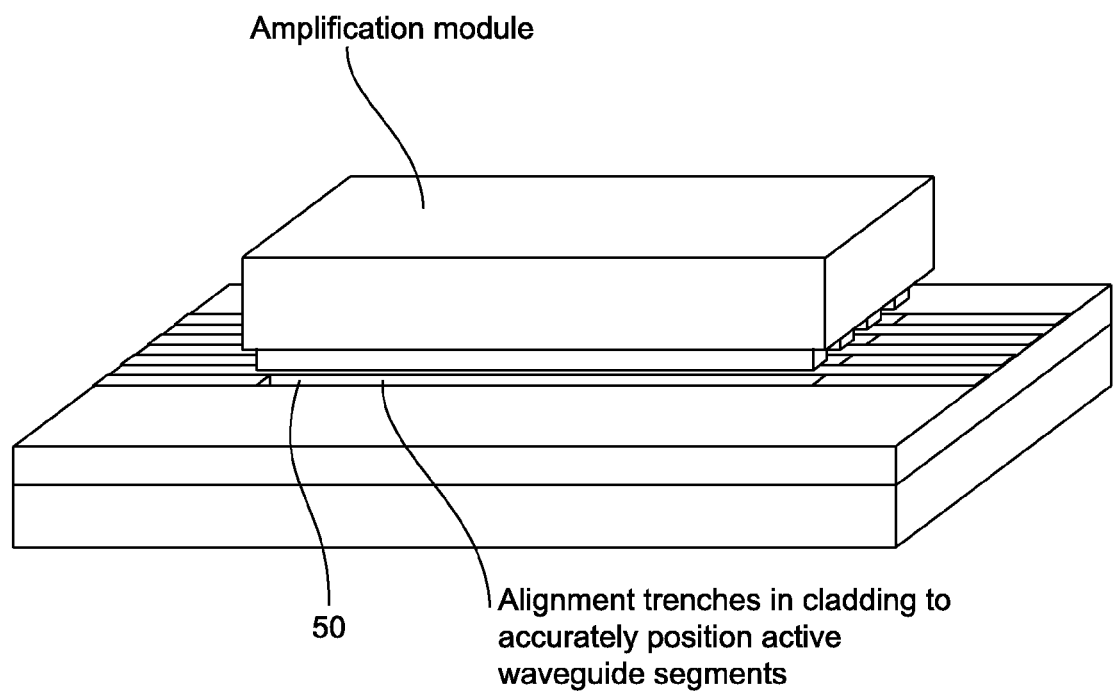
Figure 13:
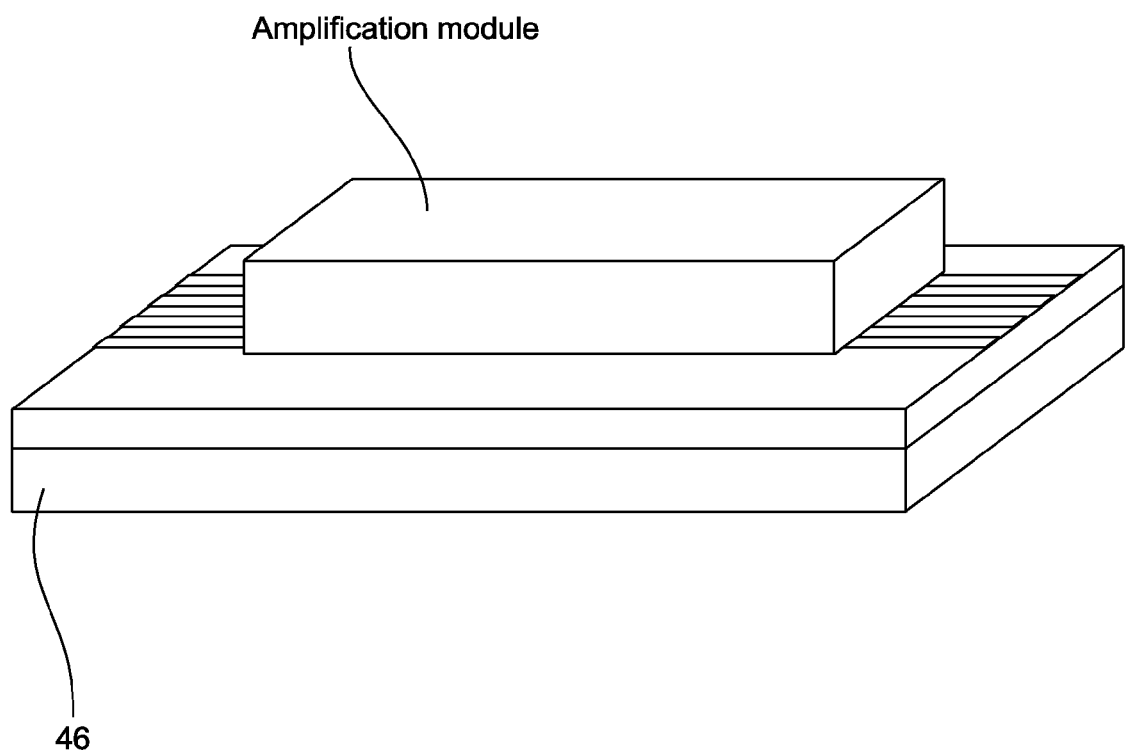

FIGS. 12 and 13 show the steps of assembly of an amplification module into a PCB. In FIG. 12, the amplification module with the active waveguide segments 42 is brought into proximity of the trenches 50 on the PCB 46. In FIG. 13, the amplification module is pressed downwards so that the active waveguide segments fill the trenches 50 and are automatically in alignment with the passive waveguide segments already on the PCB 46.

Figure 14:
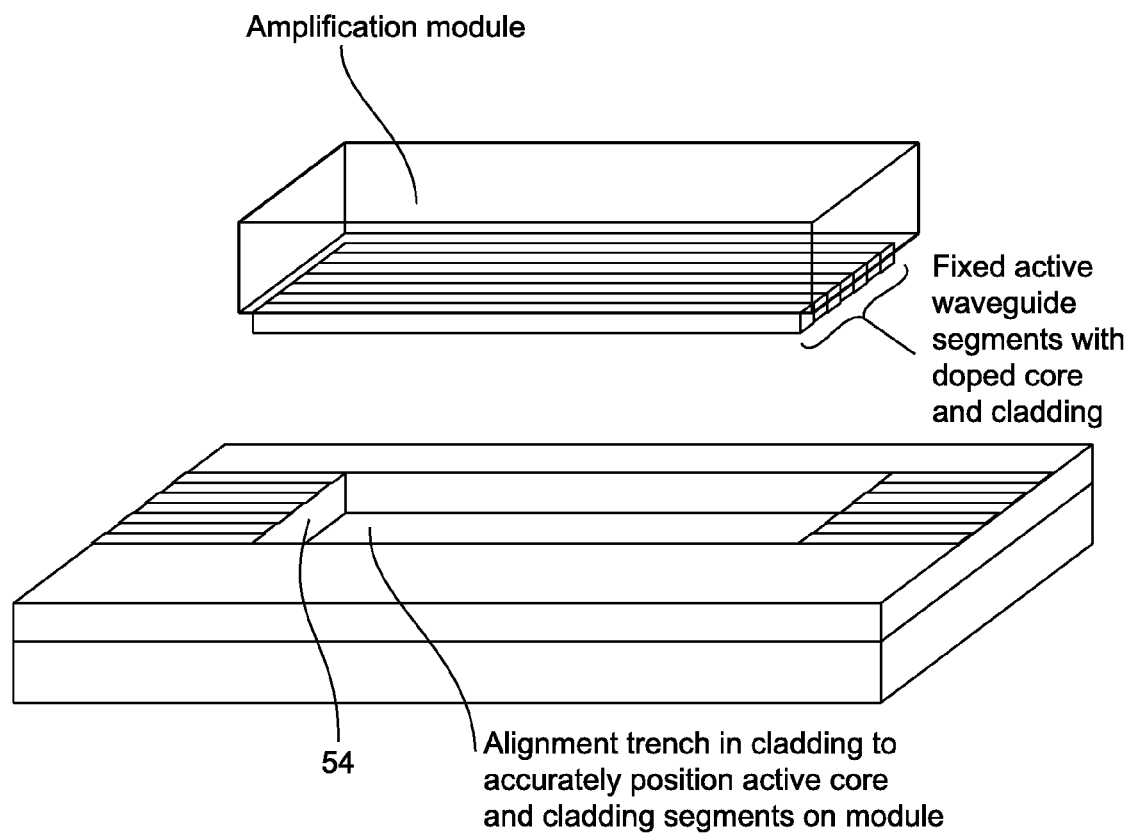
FIGS. 14 to 16 show stages of arrangement of an amplification module within an opening on an optical PCB.
Figure 15:
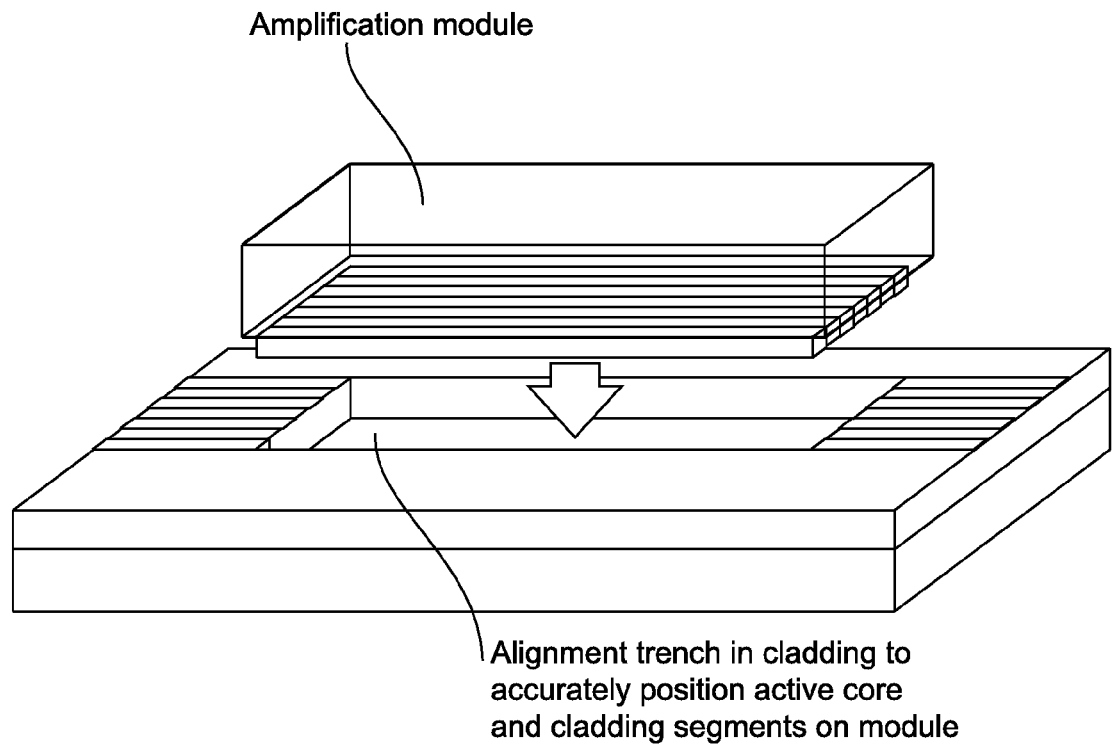
Figure 16:
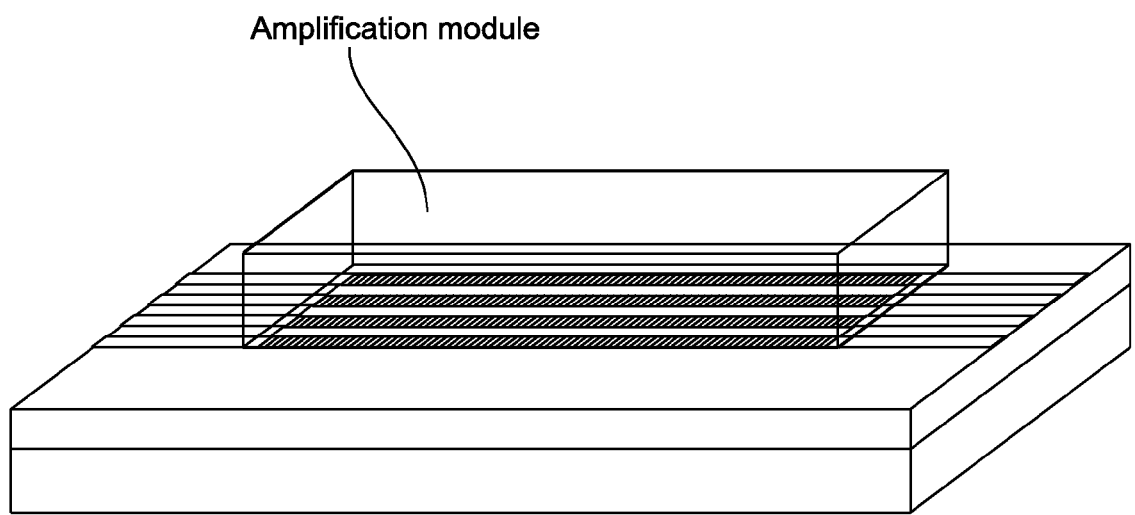

FIGS. 14 to 16 show another embodiment. In this example, both doped core and doped or undoped cladding segments are incorporated onto the amplification module, forming a continuous waveguide segment. This both increases the amplification gain and simplifies the fabrication of the board alignment features. Instead of a number of thin, densely-packed trenches which, although working well, require precision control during fabrication, a single trench 54 is formed. The alignment trench 54 in the cladding serves to ensure accurate positioning of the active core and the cladding segments on the amplification module.

Figure 17:
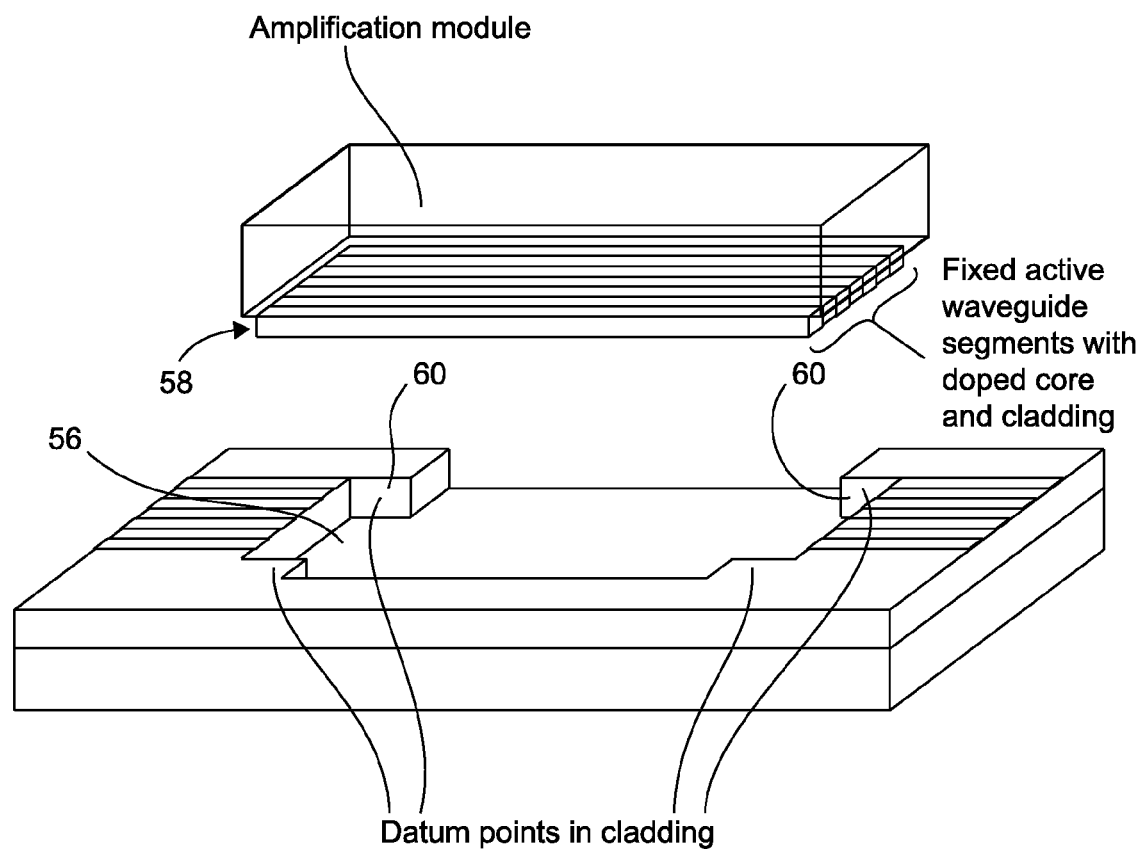
FIG. 17 is a schematic representation of an opening in an optical PCB and an amplification module for arrangement within the opening.

FIG. 17 shows a further embodiment. In this example, the trench 56 does not completely encompass the active waveguide section 58 forming part of the amplification module. Rather, datum points 60 are provided to ensure alignment between the waveguide segments associated with the amplification module and the passive segments formed on the PCB. The "piston effect" that can occur during alignment is therefore avoided. The "piston effect" refers to the effect of forcing the active segments into the enclosed trench and therefore generating resistance due to compression of the air within the trench. Preferably, there are at least four datum points in the trench against which the active waveguide segment can mechanically register to ensure good alignment with the passive waveguide segments on the PCB.

These datum points can be formed either by patterning the cladding, or, by adding features in the core layer. The latter increases the alignment precision of the datum structures with respect to the passive waveguides on the PCB as all these core features will have been made during the same fabrication step and thus the positional accuracy between them will be maximised.

As described above, with reference to FIG. 7, in one embodiment, a feedback mechanism is provided so that the power provided by the pump source and thus the optical amplification gain can be varied so as to achieve the desired output power for the signal.

Figure 18:
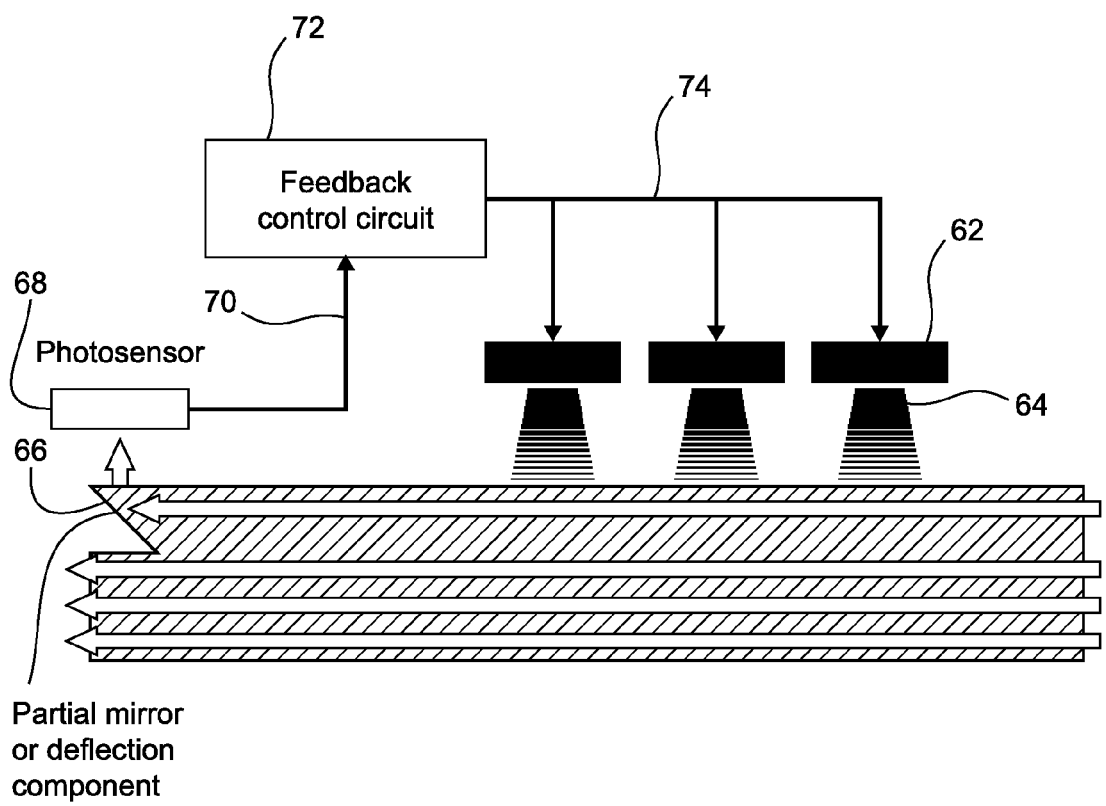
FIGS. 18 to 20 are schematic representations of sections through amplification modules with various means provided for generating a feedback signal.
Figure 19:
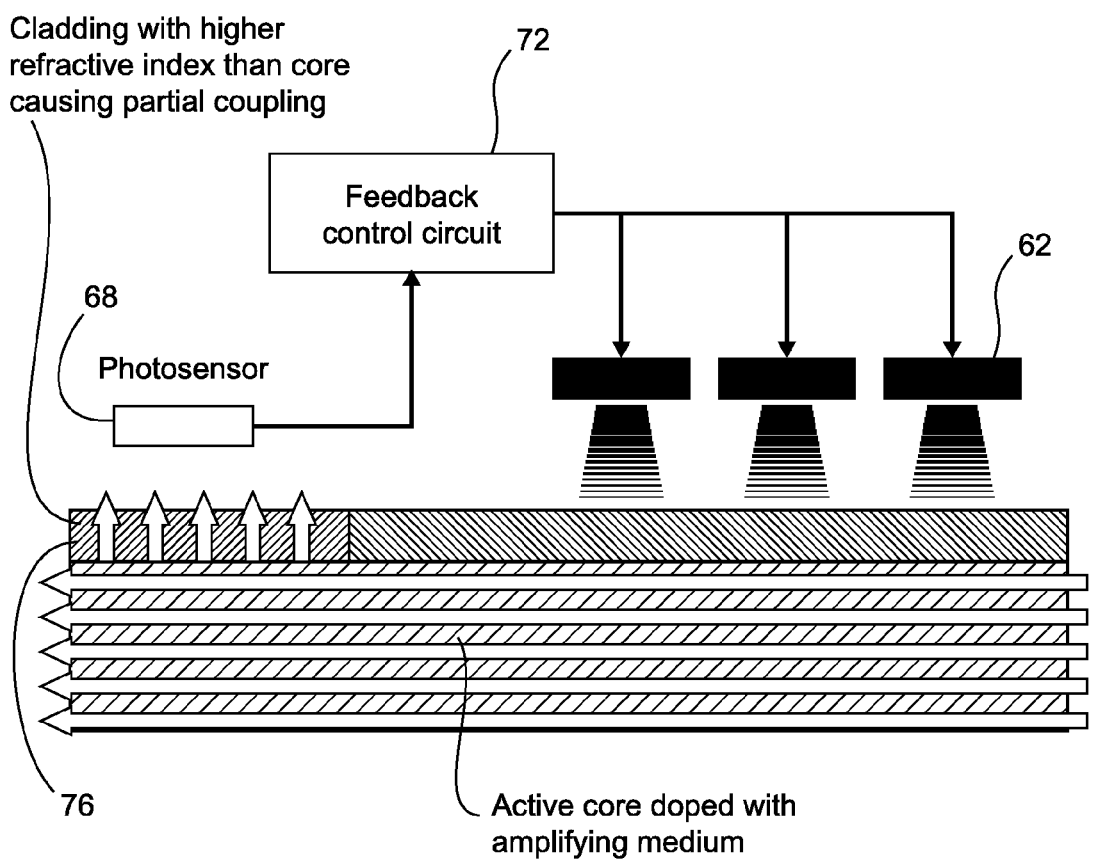
Figure 20:
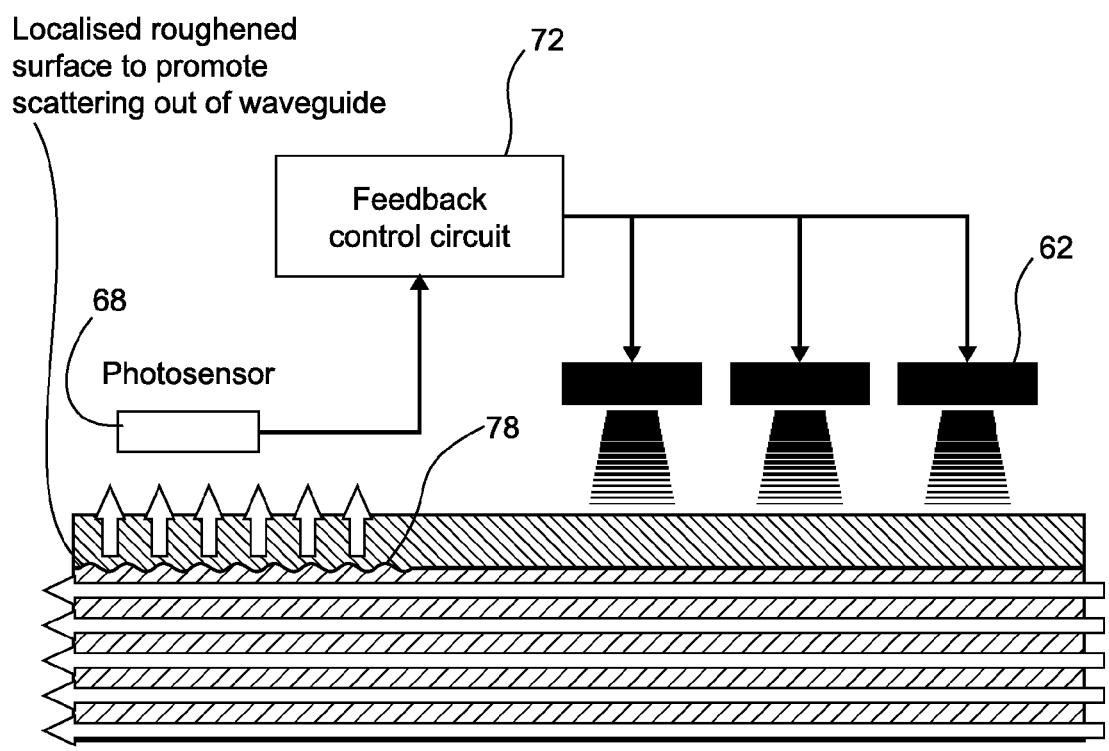

FIGS. 18 to 20 show possible examples of feedback circuits. The feedback mechanism is preferably incorporated into the amplification module to ensure consistent amplified signal strength in response to transient changes in input signal strength. This can be achieved by incorporating a feature into the post amplification end of the active waveguide which serves to divert a small proportion of the amplified signal light to an optical power monitor such as a photo sensor. The photo sensor in turn is connected to a feedback mechanism which adjusts the gain power accordingly. There are a number of ways by which the fraction of the signal light can be tapped from the waveguide. FIGS. 18 to 20 show three such embodiments. In each of these figures what is shown is a longitudinal section along one of the active doped regions of the waveguide. In other words each of the figures shows a section through a waveguide showing the direction of signal propagation along the waveguide. In an alternative, the feedback feature is incorporated into the pre-amplification end of the active waveguide. If pre-amplification feedback is used, it is necessary to predict by how much the pre-amplified signal will be amplified given a certain pump power Referring to FIG. 18, optical sources 62 are provided and serve to irradiate the active segments of the waveguides with pump radiation 64. An embedded partial mirror 66 or other reflector is provided and is arranged to deflect light from one portion of the waveguide. A photo sensor 68 is provided which provides a signal 70 to a feedback control circuit 72. The feedback control circuit then automatically adjusts the input power provided via control lines 74 to the light sources 62. This can be achieved by continuously varying the power provided to the sources or alternatively by simply turning off a selected subset of the sources.

One way by which an embedded partial mirror structure can be created is to laser cleave a 45 degree wedge into part of the waveguide cross-section. The air-core delta at the mirror interface is sufficient to ensure good deflection due to total internal reflection. Alternatively, the angled surface could be metallized.

Referring to FIG. 19 an alternative embodiment is shown. Here, instead of using a partial mirror structure, a portion 76 of the top surface at the post-amplification end of the core is clad in a substance with a higher refractive index than the core. In any waveguide, the refractive index of the core must be higher than that of the surrounding cladding and therefore by providing a part of the cladding with a refractive index higher than that of the core, there will be increased coupling of some optical signal power modes propagating in the waveguide and some evanescent modes into this enhanced cladding area. This coupled light is directed to the photo sensor 68. The photo sensor 68, as in FIG. 18, is in communication with a feedback control circuit 72 which again can be used to control the power to the light sources, e.g. by varying continuously or otherwise altering the power signals to the light sources 62.

FIG. 20 shows a further embodiment. In this case, a portion of the top surface at the post-amplification end of the core is roughened to promote scattering out of the waveguide into the feedback photo sensor 68. In other words, the active waveguide segment has part of its top cladding surface artificially roughened, corrugated or otherwise deformed, which promotes scattering and causes a proportion of the signal to be directed to the photo sensor 68. Other components of the feedback system work as described above.

It will be appreciated that many types of pump sources, such as LEDs, radiate light in a divergent beam which can easily exceed the width of a typical single-mode or multi-mode waveguide. Typically, the width of a single-mode waveguide would be between 5 and 10 µm and the width of a multimode waveguide would be between 35 and 100 µm. In order to increase the efficiency of the device, in a preferred embodiment, some focusing means is provided to focus pump light along the length of the active waveguide segment, whether as part of the module or as part of the node or PCB on which the module is arranged to be positioned. In other words, the amplification module is provided with a focusing device to focus pump light onto the active waveguide segment. This means that most, preferably all, of the pump radiation is used to generate the desired population inversion within the active doped waveguide sections.

Figure 21:
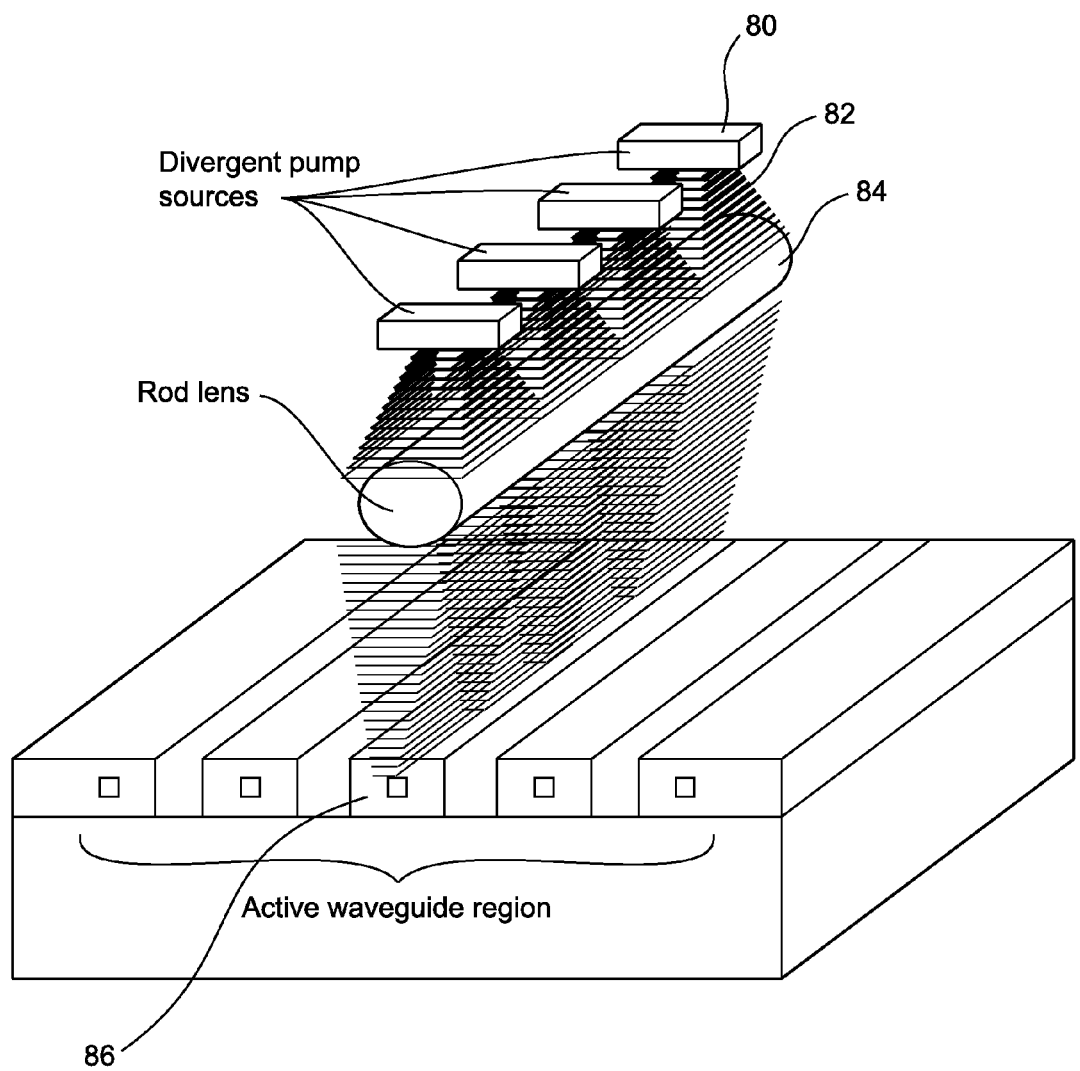
FIGS. 21 to 26 are various representations of amplification modules with different types of lenses.

FIG. 21 shows an embodiment of such a system. In this example, divergent pump sources 80 are provided to generate pump radiation 82. A rod lens 84 is provided, in alignment with an active waveguide region 86. The rod lens causes focusing of the pump radiation 82 onto the active waveguide region 86. Preferably, a rod lens is provided for each straight active waveguide segment. The rod lens 84 is arranged between a row of divergent pump sources 80 and the active waveguide segment 86. The rod lens effectively focuses the pump light into the active waveguide core, with little wastage. This significantly increases the energy efficiency of the amplification module in that, by increasing the intensity of light over the required areas, less optical pump energy (and therefore less electrical drive power) is required to achieve the desired level of gain.

Figure 22:
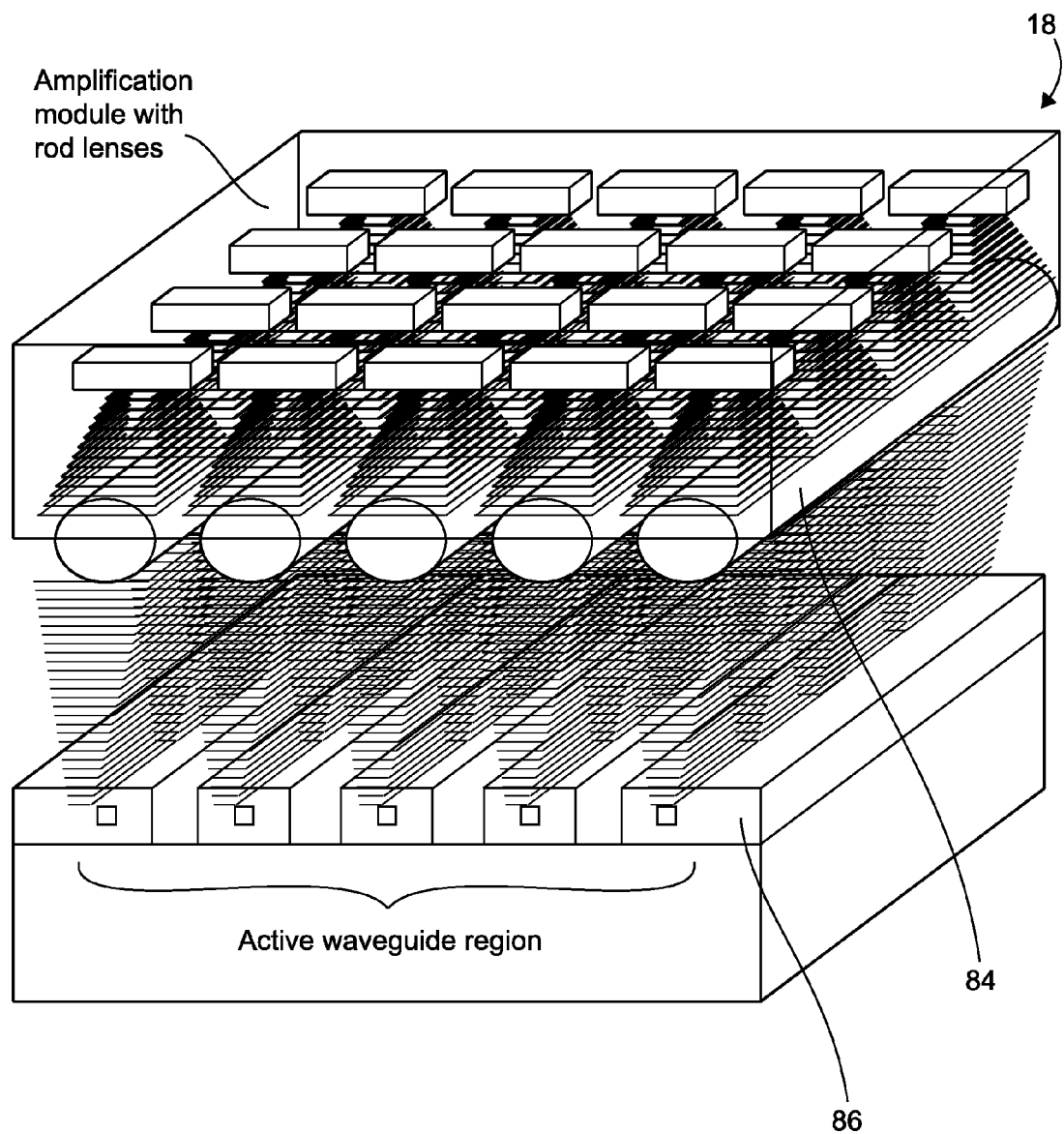

FIG. 22 shows an arrangement whereby the amplification module 18 includes plural rod lenses 84 each aligned with a corresponding one of the active waveguides 86 formed on the PCB. Thus, the rod lenses are incorporated into the amplification module, aligned to each active waveguide segment.

Figure 23:
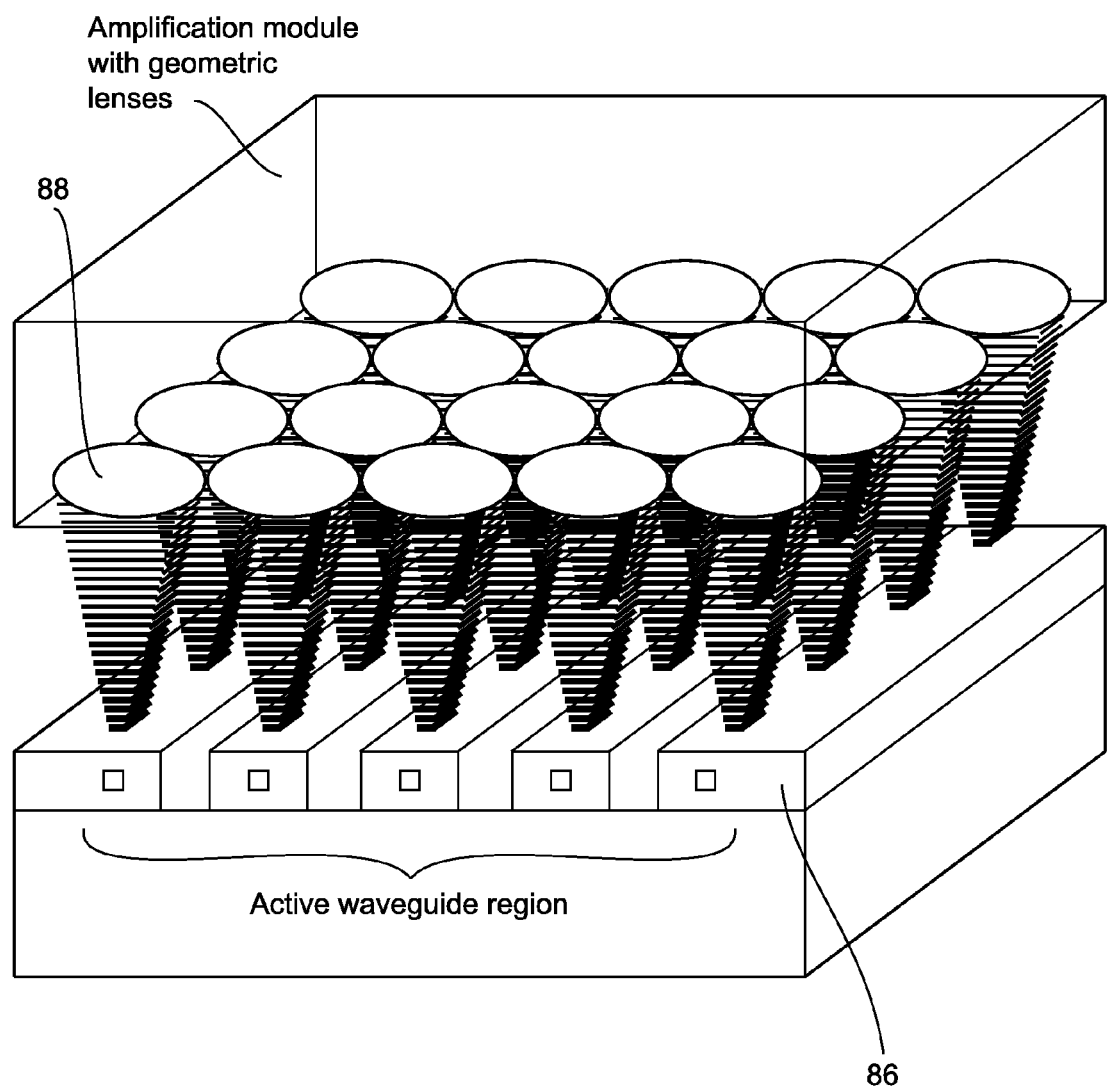
Figure 24:
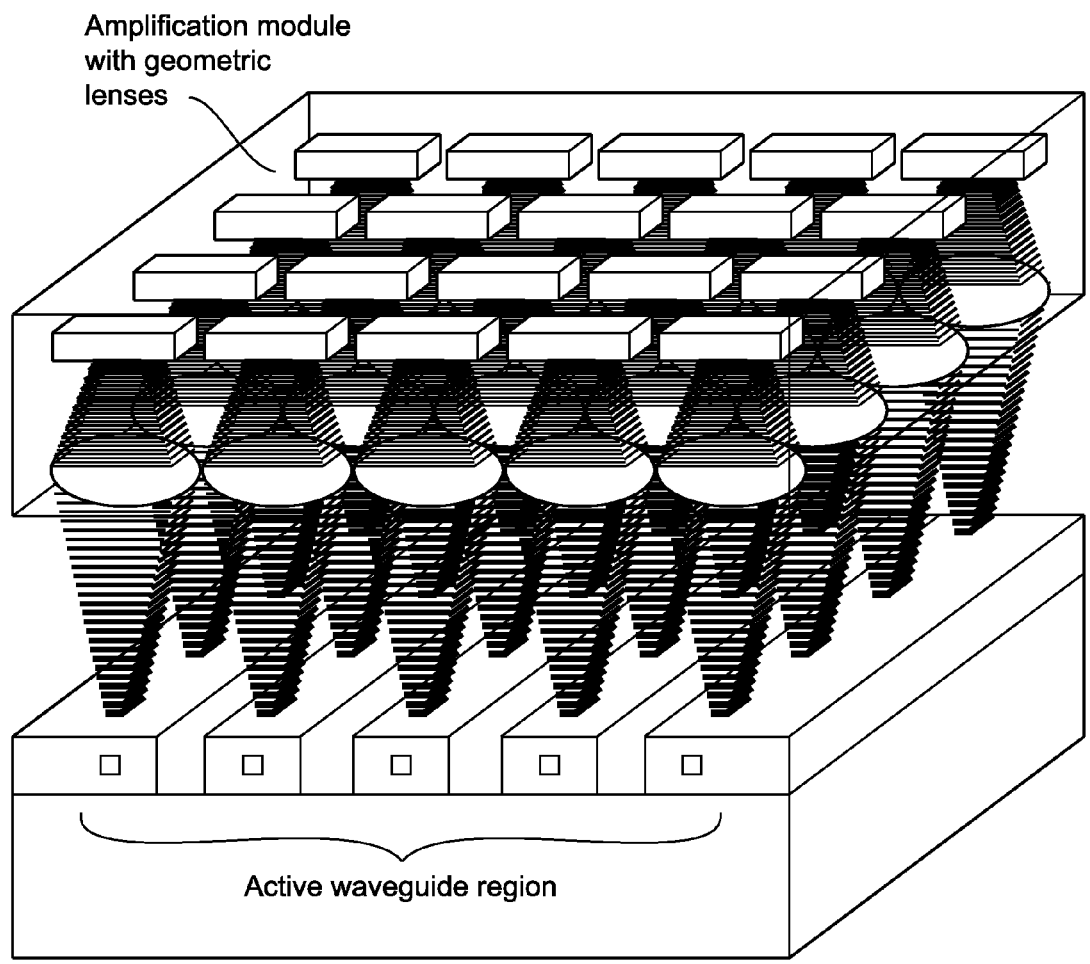

FIGS. 23 and 24 show an alternative embodiment. In this case, instead of a rod lens 84, geometric lenses 88 are provided. A two-dimensional array of geometric lenses is provided such that the output of each pump source is focused in part of the relevant active waveguide segment.

Figure 25:
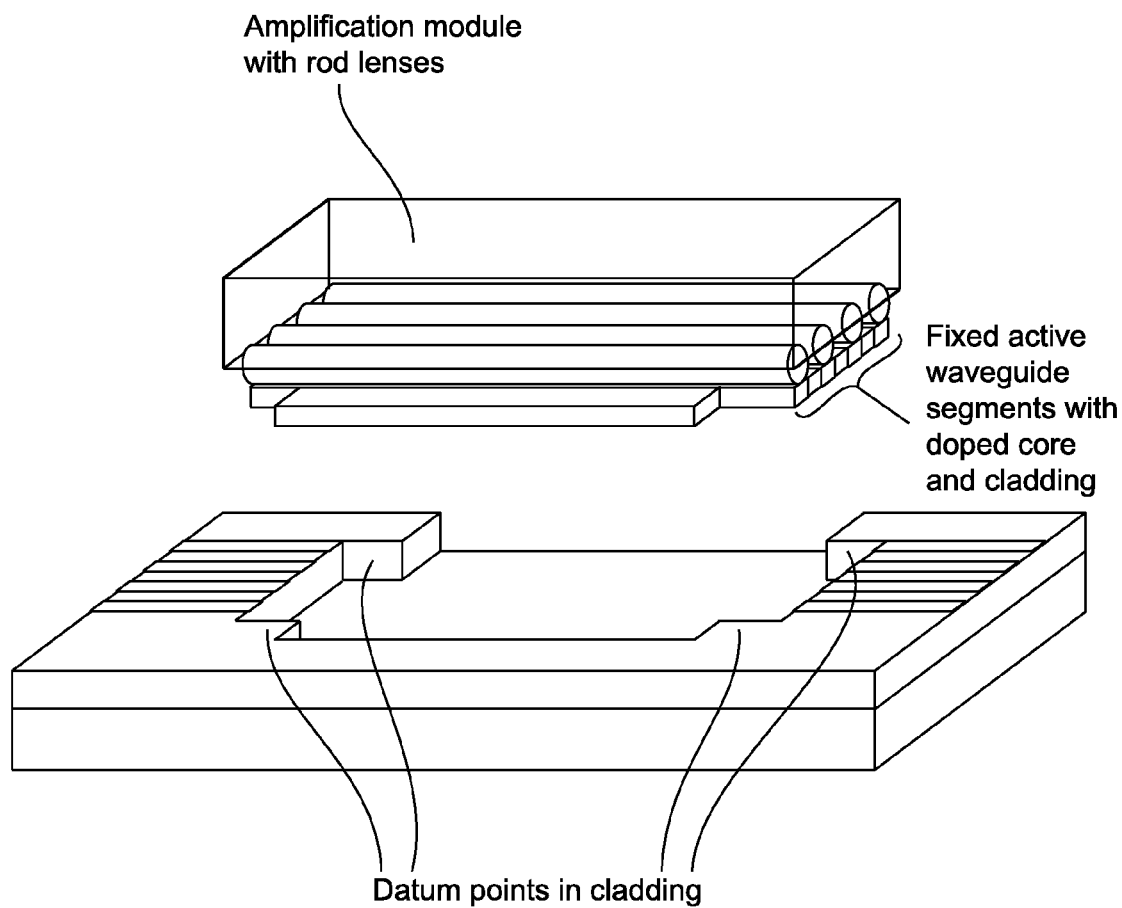
Figure 26:
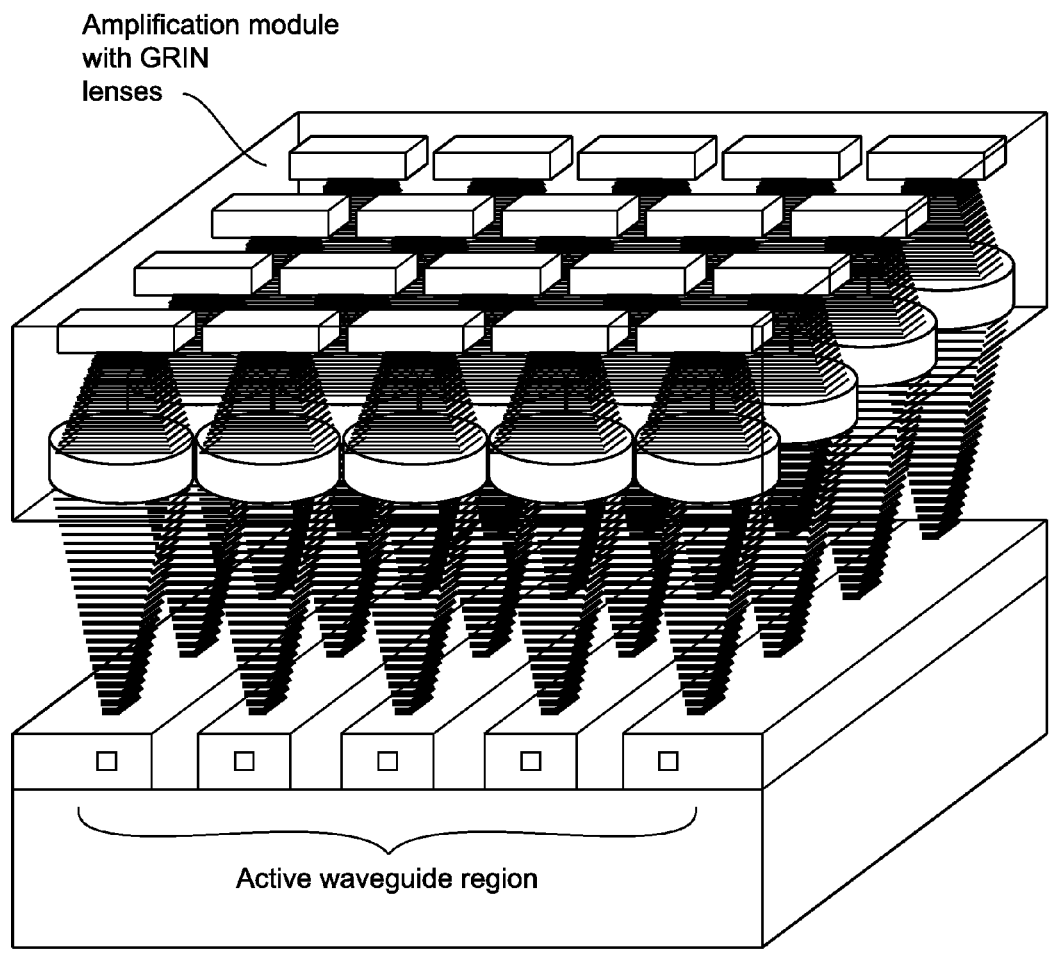

FIGS. 25 and 26 show similar arrangements in which, instead of geometric lenses, graded indexed (GRIN) lenses are used. In other words, other types of lens arrays may be arranged on the amplification module. The use of lenses allows improved discrimination of a given active waveguide segment from the other waveguide segments, allowing correspondingly improved waveguide selective gain control, i.e. the light from one pump source will affect only one waveguide and not be spread over a number of waveguide segments. Therefore, direct control of the pump source yields direct control of the waveguide in question. It will be appreciated that any suitable form of lens may be used, such as, e.g. holographic lenses. In addition, aspherical lenses could be used, which are lenses customised to be any shape for a variety of beam shaping purposes. One lens for example could be used to focus light onto a non-straight waveguide such as a curved rod lens. Alternatively, instead of multiple discrete lenses, lenses could be provided as part of a component such as a lens plate. Such a component could be molded (plastic) or ground (glass) to accommodate all required lens profiles onto a given (complex) active waveguide layout.

Figure 27:
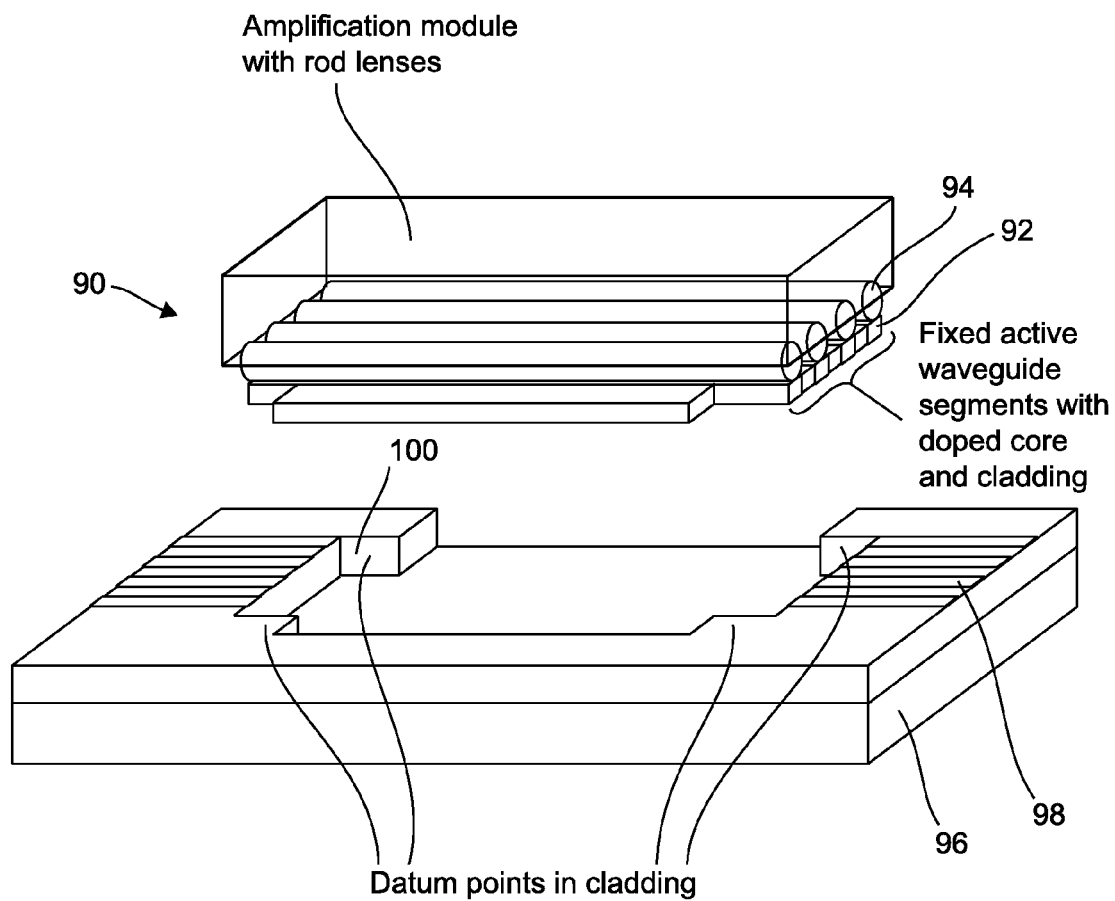
FIGS. 27 and 28 show schematic representations of two different types of replaceable amplification modules.
Figure 28:
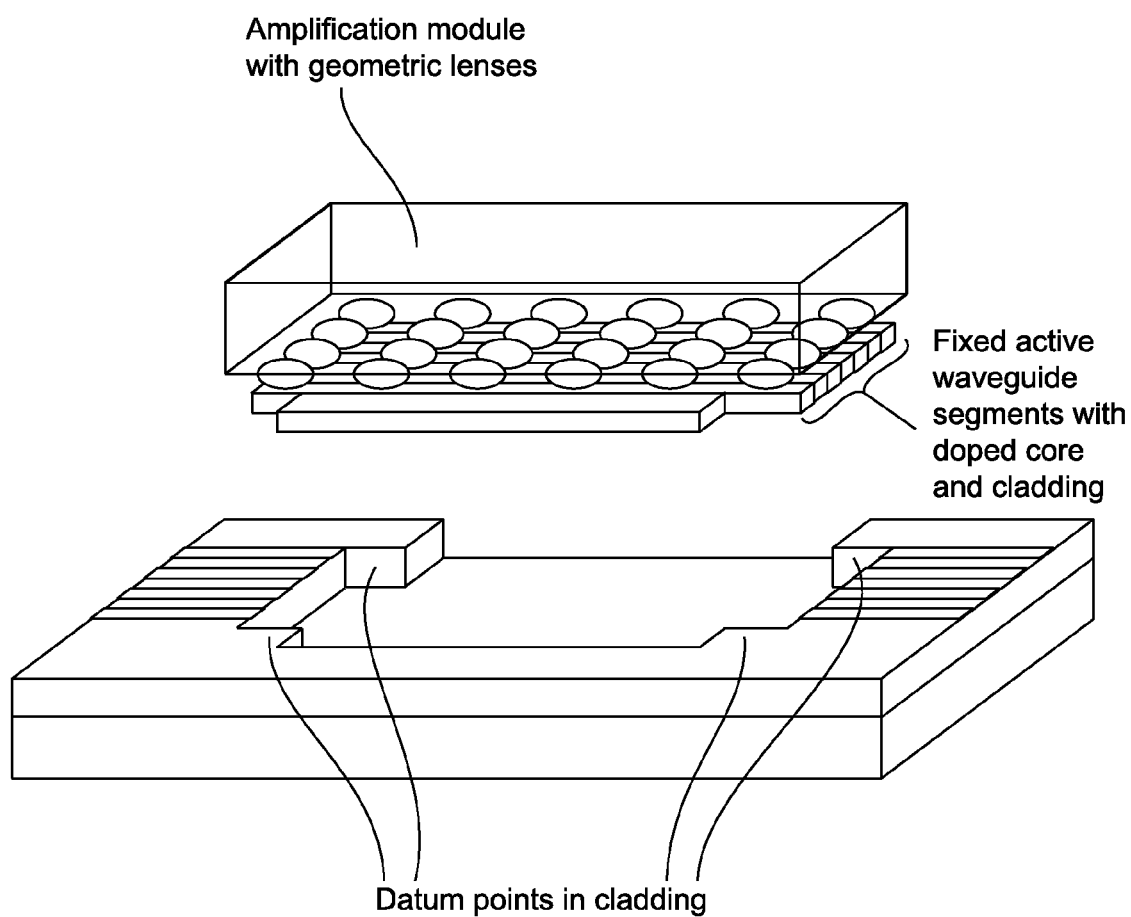

FIGS. 27 and 28 show examples in which the amplification module includes integrated active waveguide segments and lenses as well. The lenses are arranged in the amplification modules with the integrated active waveguide segments in order to focus pump light more efficiently to the active segments. FIG. 27 shows an example in which the amplification module 90 includes fixed active waveguide segments 92 together with rod lenses 94 all integrated into the amplification module 90 itself. In other words, the PCB 96 is passive and merely includes the passive waveguide segments 98 which will correspond and align with the fixed active waveguide segments on the amplification module 90 when said amplification module is arranged in place. In the example shown in FIG. 27, datum points 100 are provided to ensure alignment between the amplification module 90 and the active segments of the waveguides 92 with the passive waveguide segments 98 on the PCB 96.

FIG. 28 shows a similar arrangement to that of FIG. 27 except that instead of rod lenses 94 being provided, individual geometric lenses are provided. Again, other types of lenses can be used. In a preferred embodiment, GRIN lenses are used.

In general, in all embodiments disclosed herein, rod lenses are preferable, especially if the active waveguide segments are straight. The use of rod lenses ensures that, in use, light is focused only in one dimension, i.e. into the width of the waveguide, but not along the length of the waveguide. Therefore, the focused light is more uniformly distributed along the length of the waveguide as opposed to discrete lenses which would focus the light into discrete spots, possibly not therefore fully utilising the amplification potential of the unilluminated sections. In one embodiment the doping of the active waveguide segments is patterned in such a way as to correspond to the focus regions of pump radiation. In other words, the concentration of dopant within an area or areas on a waveguide segment may be increased in regions where increased intensity of pump radiation is expected or controlled to fall.

Figure 29:
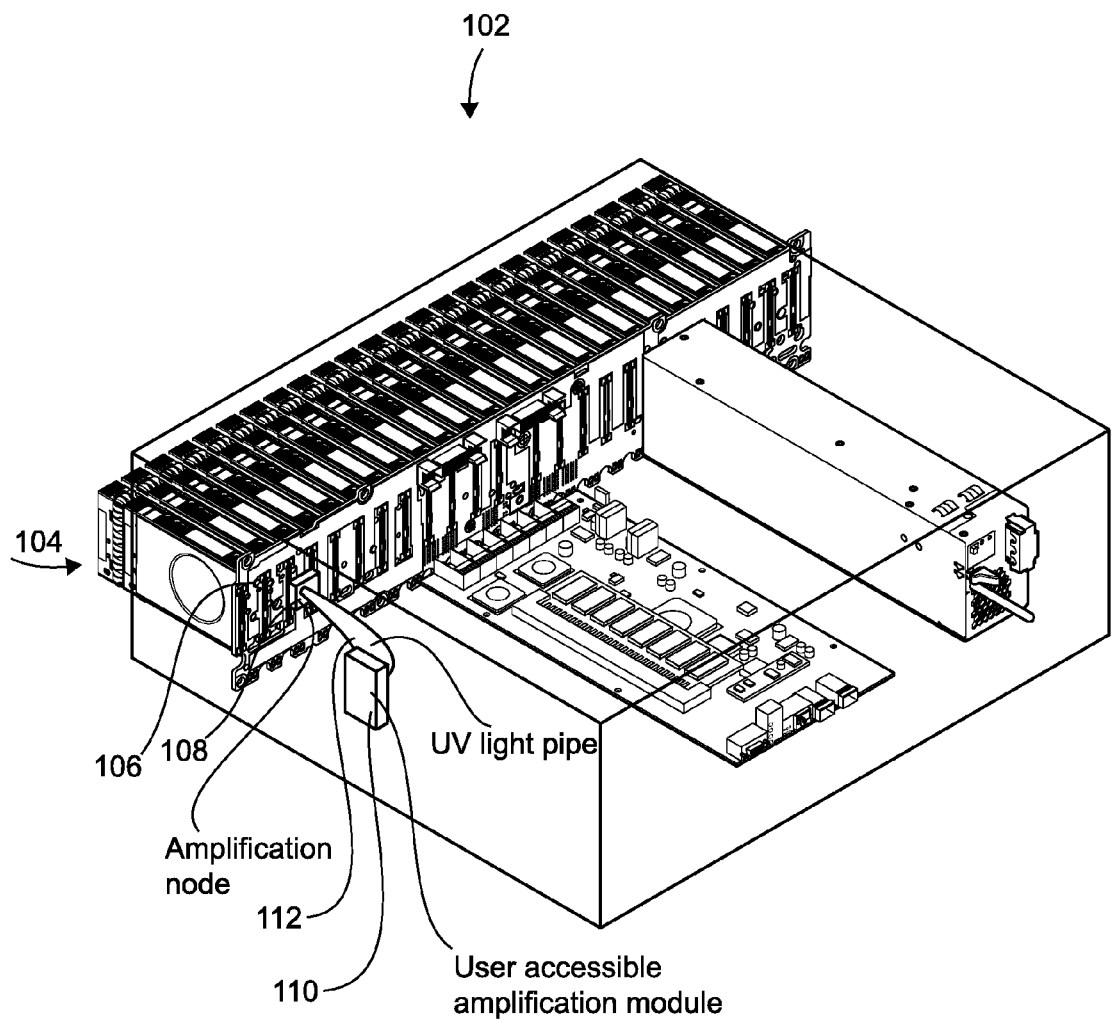
FIG. 29 shows a schematic representation of a storage system.

FIG. 29 shows a schematic representation of a storage assembly 102. The storage assembly comprises plural storage devices 104 which might be hard disk drives. A backplane/midplane/motherboard 106 is provided which includes various amplification nodes and/or modules 108. So as to avoid having to provide light sources on the midplane, in the example of FIG. 29, an easily accessible external UV light source 110 is provided. This is connected to the amplification node or module 108 via a light pipe 112. In other words, instead of providing the light source in the immediate vicinity of the midplane and/or the amplification nodes and modules, the UV light source is effectively remote but coupled to the amplification nodes and modules with the UV light pipe 112.

This arrangement provides some significant advantages. In particular, the backplane remains passive. This allows amplification modules to be easily replaceable without disassembling the entire backplane. Therefore, an amplification module can be arranged at a convenient location for the user such as at the front end or side of the box of the storage system 102. The UV light is then directed internally to the required location by the UV light pipe 112. An example of a suitable UV light pipe is that produced by Edmund Optics and identified as TECHSPEC Fused Silica Light Pipe Homogenizing Rods. It will be appreciated that light pipes are effectively crude waveguides, usually preformed shapes made of optically transparent materials used directly in air to convey optical energy. Typically, they are orders of magnitude larger than communication waveguides and are primarily used to convey optical energy for illumination and not communication purposes.

At the amplification node, the interface between the UV light pipe and the amplification node can be the same as described in the embodiments described above involving local amplification modules. These interfaces include, but are not limited to diffusion sheets, diffusion sheets with strips to isolate individual active waveguide segments, and lenses including geometric lenses such as rod or spherical lenses or graded index lenses to focus UV pump light onto individual waveguides.

Figure 30:
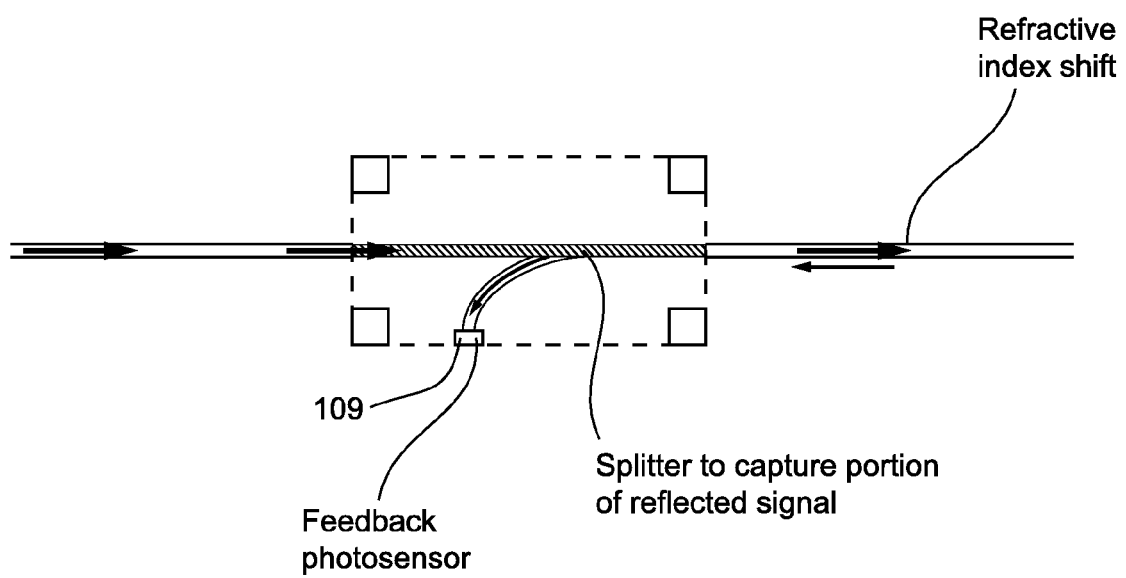
FIG. 30 is a schematic representation of an amplification module including a feedback photo sensor.

FIG. 30 shows a schematic representation of a back-reflection feedback tap. In this example, after the amplification node, a slight change in refractive index is introduced into the waveguide core. This will cause a partial back-reflection of the signal. A proportion of the back reflective signal is then tapped off by a splitter and directed to a photo sensor 109. This provides another means for producing feedback and enabling control of the device.

Figure 31:
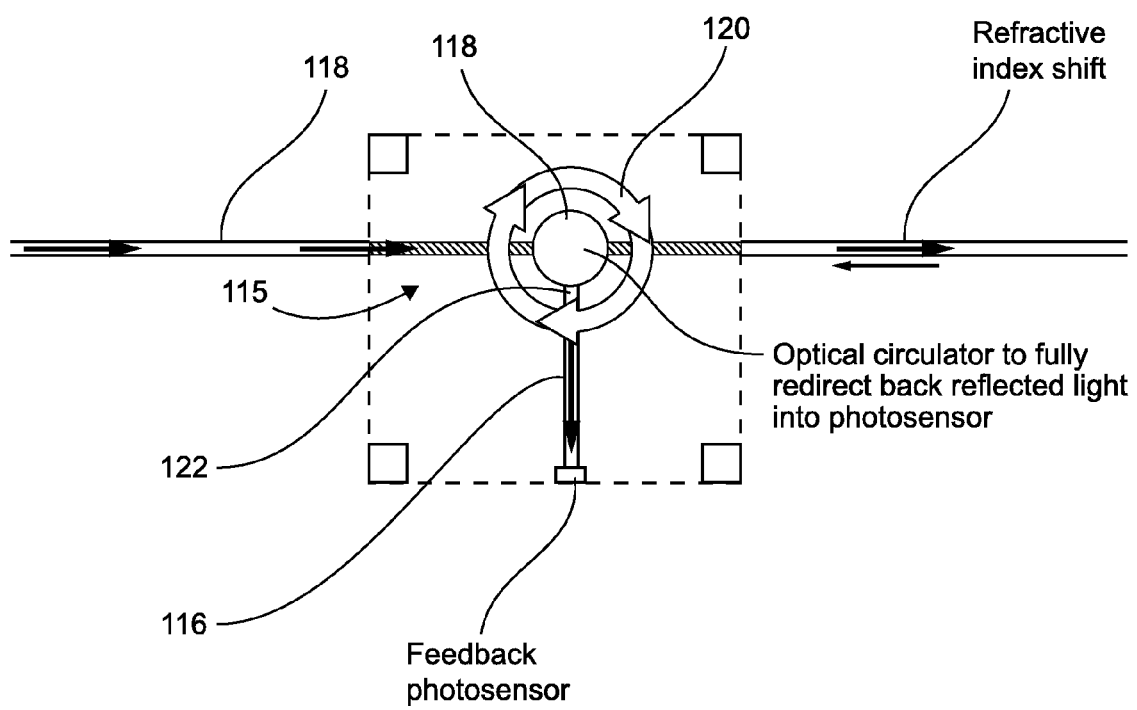
FIG. 31 is a schematic representation of a back reflection feedback tap including an optical circulator.

As can be seen from FIG. 30, to maximise the amount of light travelling along the photosensor branch, the refractive index of the photosensor branch is increased relative to that of the original branch. Referring now to FIG. 31, one way to further maximise the amount of light being tapped off in the reverse direction is with the use of an optical circulator 115. An optical circulator ensures that all signal light going from left to right in the image is transferred while the small portion of back reflected light at the refractive index shift interface travelling from right to left is fully or mostly tapped off in the direction of the photosensor.

Referring now to the example of FIG. 31, the optical circulator 115 has three ports 118, 120 and 122. As is known, an optical circulator is a fiber-optic component that can be used to separate optical powers that travel in opposite directions in one single optical fibre or waveguide, analogous to the operation of an electronic circulator. For the purpose of this example, the primary signal is thought of as entering from the left, i.e. via port 118. The device allows light to travel in only one direction, from port 118 to port 120, then from port 120 to port 122. Thus, if some of the light travelling from left to right emitted from port 120 is reflected back to the circulator 115, it is directed on to port 122 which leads to the photosensor and not back to port 118.

Use of the circulator 115 allows all back-reflected light to be redirected to the photosensor and not along the original waveguide back to the transmitter.

Figure 32:
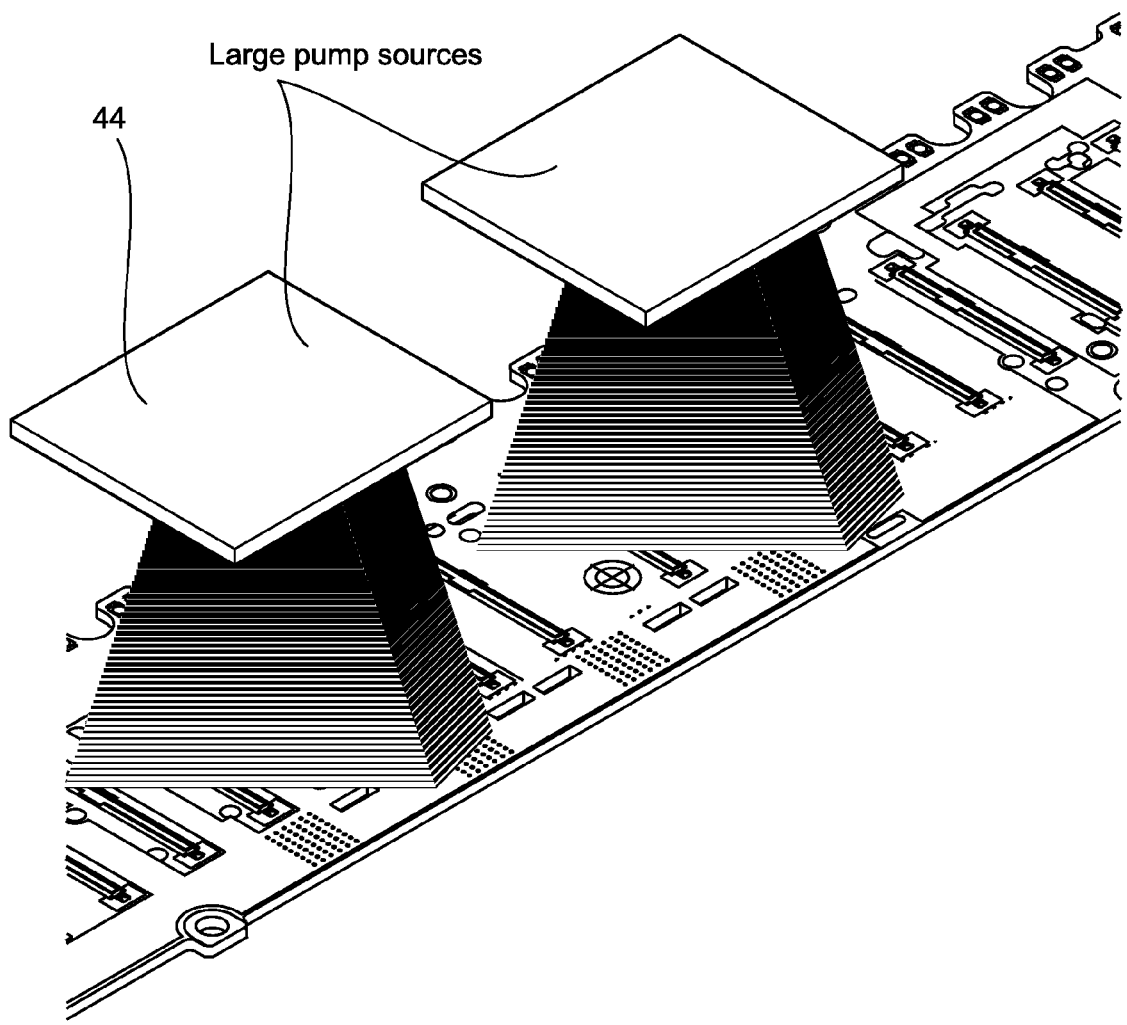
FIG. 32 is a schematic representation of an optical PCB including large pump sources.

FIG. 32 shows an embodiment in which large pump sources 114 are provided. In this example the entire waveguide network as fabricated on an optical PCB is composed of doped polymer. The pump source 114 serves to irradiate the whole board providing weaker amplification throughout the entire waveguide network. Although in practice some components such as mechanical connectors will block certain parts of the waveguide from receiving the pump radiation, most parts will receive the pump radiation and generate amplification accordingly.

The amplification mechanism is thus low-cost and easy to implement. Instead of sophisticated control systems to ensure waveguide selectable levels of amplification, a blocking material is preferably used to cover different lengths of different waveguides so as to ensure that over the length of an entire waveguide the desired amplification is achieved. These blocking patterns could preferably be implemented by photoresist integrated into the PCB layout.

It will be appreciated that the use, in embodiments, of polymer waveguides provides a cost-effective and technically efficient means of embedding optical circuitry into PCBs. The use of selectively controllable amplification modules in order to convey optical signals over more than 1 meter of waveguide enables polymer waveguides to be used without the need to ramp up the source optical transmit signal.

The use of on-board optical amplification would also be extremely useful on large scale data centre backplanes with embedded optical channels as explained above with reference to FIG. 1A.

The systems described herein would find application in diverse technological fields including for example, aerospace such as the use of optical links in aerospace vehicles such as jets to convey sensor information to primary processing nodes. In addition, the technology would find use on passenger aerospace vehicles. Optical links in large passenger planes could be used to convey sensor and multimedia information across the plane (e.g. video on demand for passengers). In High Performance Computing the technology could be used as embedded optical channels in HPCs would enable servers to accommodate large bandwidth densities around processor nodes. In the field of automotive technologies, the technology would find use such as in the distribution of sensor and media information in cars (polymer optical fibres are already used in luxury vehicles). Last, by way of example, the field of telecommunications would find use for this technology in that embedded optical channels in network nodes, access networks or Head end systems can be used to accommodate huge bandwidth densities.

Furthermore, amplification technology would also enable direct passive optical coupling between external optical cables and the embedded waveguides in the PCB, which can be lossy due to clipping and numerical aperture mismatch, when using standard fibres.

Intel have developed new low-cost optical transmission chips which operate at 1310 nm and 1550 nm. As polymer is lossier at these wavelengths, the present system would also enable data transmission between silicon chips on an optical PCB thus overcoming a significant performance advantage of silica waveguides over polymer waveguides.

There will now be described embodiments in which electroluminescent polymer waveguides are utilised. It is known that polymer light-emitting diodes (PLED), and more generally, light-emitting polymers (LEP), typically comprise an electroluminescent conductive polymer, that emits light when connected to a power source such as an external voltage. They are conventionally used in the form of thin films for full-spectrum colour displays. Polymer Organic light emitting diodes (OLEDs) are efficient and require a relatively small amount of power for the amount of light produced.

Polymers are not suitable for vacuum deposition, however they can be processed in solution and spin coating is a common method of depositing thin films of polymers. Such a method is more suited than thermal evaporation to forming large-area films, although formation of multilayer structures is difficult using spin coating as the application of subsequent layers will tend to dissolve those layers already present. An advantage is that no vacuum is required, and the emissive materials can also be applied on the substrate by techniques similar to or derived from inkjet printing, e.g. commercial inkjet printing. However, the metal cathode as used to provide power to the LEP may still need to be deposited by thermal evaporation in vacuum.

In one embodiment, such conductive electroluminescent polymer light emitting diodes emitting at the pump wavelength (e.g. UV) are constructed directly on the optical PCB substrate near or in the amplification node. Indeed in a preferred embodiment, the active waveguides themselves are formed from an electroluminescent polymer with electrodes attached to them. These active waveguides are composed of the electroluminescent polymer and doped with an amplification medium as described above.

This arrangement provides an integrated amplification solution for space limited applications as the active waveguides would luminesce at the pump wavelength when current is passed through it and literally pump itself without the need for external components. Typical polymers used in PLED displays include derivatives of poly(p-phenylene vinylene) and polyfluorene as disclosed in, for example, A. J. Heeger, in W. R. Salaneck, I. Lundstrom, B. Ranby, *Conjugated Polymers and Related Materials*, Oxford 1993, 27-62. ISBN 0198557299). The entire contents of this article are hereby incorporated by reference. Substitution of side chains onto the polymer backbone may determine the colour of emitted light or the stability and solubility of the polymer for performance and ease of processing, as disclosed in, for example, R. Kiebooms, R. Menon, K. Lee, in H. S. Nalwa, *Handbook of Advanced Electronic and Photonic Materials and Devices Volume* 8, Academic Press 2001, 1-86. The entire contents of this article are hereby incorporated by reference.

Figure 33:
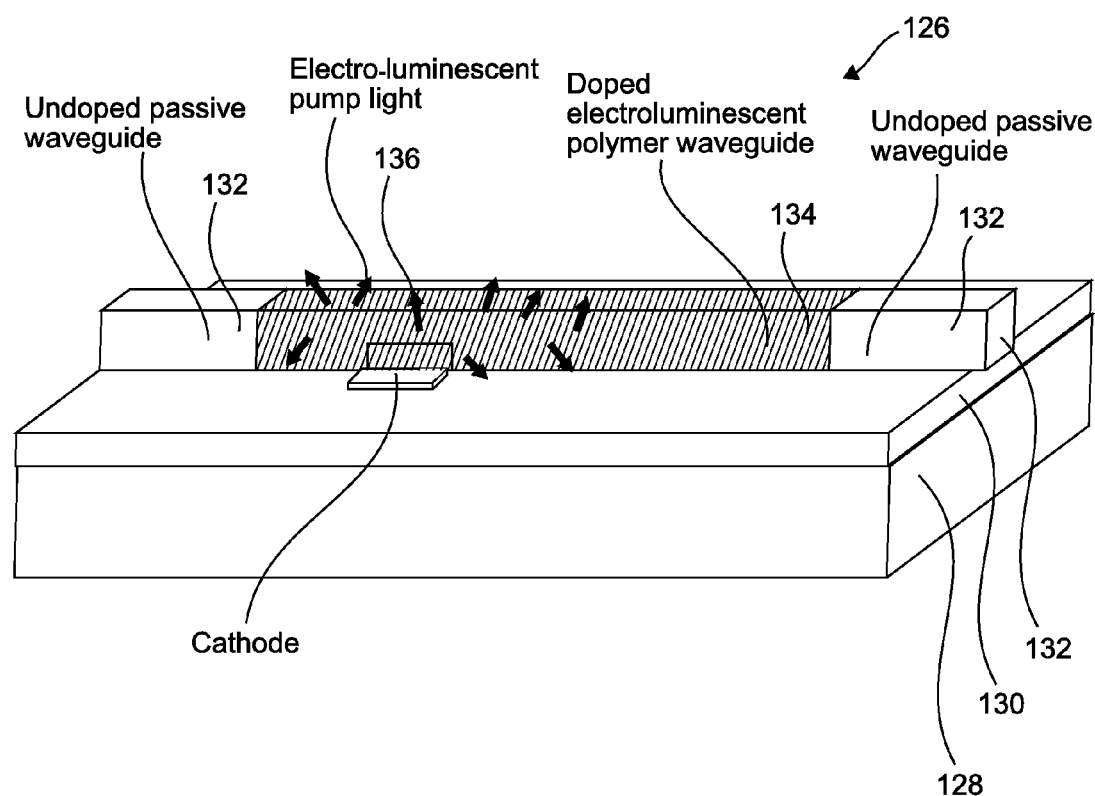
FIG. 33 is a schematic representation of an electroluminescent self-pumping waveguide.

FIG. 33 shows a schematic representation of a "self-pumping" doped electroluminescent polymer waveguide. The waveguide 126 is formed on a substrate 128 having a lower cladding layer 130 formed thereon. As can be seen, input and output sections 132 are provided formed of undoped polymer. These are referred to as passive sections of the waveguide. A central, active, region 134 is provided. Electrical contacts (only one shown) 136 are provided formed in conductive communication with the active region 134 of the self-pumping doped electroluminescent polymer waveguide. The active region 134 is formed of an LEP that emits light when connected to an external voltage via the contacts 136. In addition, the active region 134 is doped with an optical amplifying material as described above. The amplifying dopant is pumped so as to be able to amplify signals passing along the waveguide in the manner described above.

Accordingly, the use of self-pumping doped electroluminescent polymer waveguides enables an amplification module to be formed without an additional light source for pump radiation as described previously since the electroluminescence functions as the pump source itself. Waveguide selective signal amplification is thus enabled with a reduced part count since the pump source is effectively integrated into the waveguide itself. Accordingly a waveguide such as that shown in FIG. 33 can be used either alone or in combination with others without any significant detriment or advantage either way.

In some cases, electroluminescent polymers that emit at the required pump frequency may not have the required or desired degree of transparency at the signal wavelength. To enable advantage to be taken of the use of such electroluminescent polymers, in these cases, instead of using the electroluminescent polymers as part of the core structure of the waveguides within an amplification node, the electroluminescent polymers are used to form at least part of the cladding.

In one example, a doped waveguide core is provided as described above. The cladding (usually the upper cladding) is removed from the amplification node. The cladding space, i.e. the region from which the cladding has been removed, is filled with electroluminescent polymer using any of the possible methods described above. The electroluminescent polymer is thus used as the cladding for a "normal" doped waveguide. The refractive index of the electroluminescent polymer is selected to be lower than that of the core doped polymer region (even just slightly lower) so that the condition for waveguiding, i.e. the enabling of total internal reflection at the cladding core boundary, is satisfied.

This arrangement is particularly advantageous. Where the cladding is formed of an electroluminescent polymer, the formation of metal or other such conductive contacts, is straightforward as the electroluminescent section is a large structure spanning the amplification node. Preferably the electroluminescent section of the cladding spans the entire width and/or length of the amplification node. In one embodiment, multiple individual electroluminescent cladding sections are fabricated around subsets of waveguides in the amplification node. This arrangement in general, i.e. the use of an electroluminescent polymer in the cladding, enables highly efficient pumping of the embedded active waveguides to be achieved.

In one preferred embodiment, so as to improve the efficiency of coupling of pump light to the active waveguides beneath the electroluminescent polymer in the cladding, the top and/or sides of the electroluminescent cladding section is mirrored, e.g. through metallisation, to ensure that light that would be otherwise lost is directed to the target waveguide(s). Thus, the metallisation serves to reflect and direct and concentrate the generated light into the active waveguide core(s). As the electroluminescent section is preferably metallized anyway for electrode contact, this enables a synergistic effect in that the metallisation serves two purposes, both providing conductive contact and also directing, i.e. reflecting, generated light to the desired part of the underlying structure.

Figure 34:
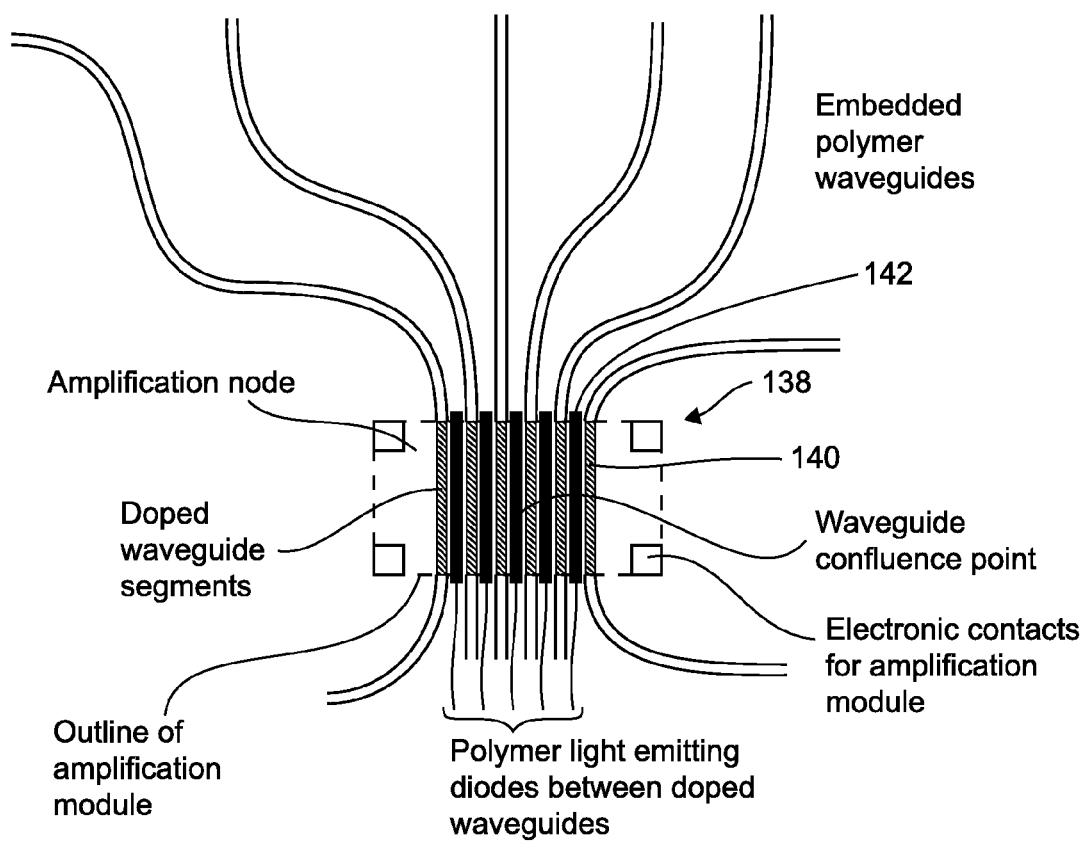
FIG. 34 is a schematic representation of an amplification module including an electroluminescent pump source.

FIG. 34 is a schematic representation of an amplification module including an electroluminescent pump source. The amplification module 138 comprises plural waveguide sections 140 as described above. Each of the sections 140 is doped as described above with an amplifying dopant arranged such that on pumping of the waveguide sections signal light passing through is amplified. In this example though, instead of providing pump sources above as in the example shown in, say, FIG. 4, electroluminescent pump sources 142 are provided arranged between the active waveguide segments 140.

Thus, the amplification node is arranged to include electroluminescent polymer light emitting diode waveguides or structures in close proximity to each active waveguide 140. By providing electric contacts (not shown) on each pump structure 142, independent control over the strength of luminescence from each separate pump waveguide is provided. This allows waveguide selective amplification in a simple, reliable and controllable manner. It will be appreciated that any one or more of the waveguides within an amplification module may be formed to include electroluminescent polymer as described above.

Embodiments of the present invention have been described with particular reference to the examples illustrated. However, it will be appreciated that variations and modifications may be made to the examples described within the scope of the present invention.

The invention claimed is:

1. An optical printed circuit board (PCB), comprising:
plural independent polymer waveguides, each waveguide having a different independent amount of loss, each of the waveguides having an active segment, each of the active segments being doped with an amplifying dopant, and each active segment independently having a length based on balancing the independent amount of losses of the respective polymer waveguides;
an amplification node, each active segment of the waveguides going through the amplification node; and
an amplification module comprising a pump source comprising plural light sources arranged to provide independently controllable levels of pump radiation to the active segments of the waveguides at the amplification node.

2. An optical printed circuit board according to claim 1, in which each of the plural light sources comprises one or more light emitting sources arranged to irradiate light onto only one of the active segments.

3. An optical printed circuit board according to claim 2, in which each of the plural light sources comprises a row of light emitting diodes.

4. An optical printed circuit board according to claim 1, further comprising a diffuser to diffuse light emitted from the pump source.

5. An optical printed circuit board according to claim 4, in which the diffuser comprises one or more of a translucent layer, ground glass, teflon, a holographic diffuser, an opal glass diffuser, and greyed glass.

6. An optical printed circuit board according to claim 4, further comprising a rod lens to focus light from the pump source onto one or more of the plural active segments.

7. An optical printed circuit board according to claim 1, further comprising plural lenses each arranged to focus light onto a corresponding region of the plural active segments.

8. An optical printed circuit board according to claim 7, in which the lenses are selected from the group consisting of geometric lenses and graded index lenses.

9. An optical printed circuit board according to claim 1, wherein the amplification module further comprises feedback control arranged to detect a signal strength of an optical signal input to or output each of the active segments of the plural polymer waveguides and to control the amplification provided thereto in dependence thereon.

10. An optical printed circuit board according to claim 1, in which the pump source is integrated into the active segments.

11. An optical printed circuit board according to claim 1, in which the pump source comprises electroluminescent polymer material.

12. An optical printed circuit board according to claim 1, wherein the active waveguide segments are arranged to optically connect to the plural polymer waveguides on the optical printed circuit board to propagate independent signals to different parts of the optical printed circuit board.

13. A data storage system, comprising a backplane, midplane or motherboard for connection of plural data storage devices and being for connection to one or more hosts, the midplane being an electro-optical printed circuit board according to claim 12.

14. A data storage system according to claim 13, comprising:
light pipe in optical communication with one or more of the amplification modules to provide optical pump radiation to the amplification modules.

15. An optical printed circuit board according to claim 1, wherein at least one of the active segments has a different concentration of amplifying dopant.

16. An amplification module for provision in an opening on an optical printed circuit board (PCB), PCB comprising plural polymer waveguides each waveguide having a different independent amount of loss, the amplification module, comprising:
plural active waveguide segments each of the active waveguide segments being doped with an amplifying dopant, and each of the active waveguide segments independently having a length based on balancing the independent amount of losses of the respective polymer waveguides;
a pump source comprising plural light sources arranged for providing independently controllable levels of pump energy to each of the active waveguide segments, the active waveguide segments being arranged to optically connect to the plural polymer waveguides on the optical PCB to propagate independent signals to different parts of the optical PCB; and
a lens arranged to focus light from a selected light source onto a corresponding region of the active waveguide segments.

17. An amplification module according to claim 16, in which each of the plural light sources comprises one or more light emitting sources arranged to irradiate light onto only one of the active waveguide segments.

18. An amplification module according to claim 16, in which each of the plural light sources comprises a row of light emitting diodes or laser diodes.

19. An amplification module according to claim 16, further comprising a diffuser to diffuse light emitted from the pump source.

20. An amplification module according to claim 19, in which the diffuser comprises one or more of a translucent layer, ground glass, teflon, a holographic diffuser, an opal glass diffuser, and greyed glass.

21. An amplification module according to claim 16, further comprising a rod lens to focus light onto one or more of the plural active waveguide segments.

22. An amplification module according to claim 16, in which the plural active waveguide segments have lengths, patterns of dopant concentration, or a combination thereof corresponding to a required amplification.

23. An amplification module according to claim 16, further comprising plural lenses each arranged to focus light from a selected subset of the light sources onto a corresponding region of the plural active waveguide segments.

24. An amplification module according to claim 23, in which the lenses are selected from the group consisting of geometric lenses, holographic lenses and graded index lenses.

25. An amplification module according to claim 16, further comprising feedback control arranged to detect a signal strength of an optical signal input to or output from each of the active waveguide segments of the plural polymer waveguides and to control the amplification provided thereto in dependence thereon.

26. An amplification module according to claim 25, further comprising an optical circulator arranged to route a portion of the optical signal to the feedback control.

27. An optical printed circuit board (PCB), comprising:
plural independent polymer waveguides, each waveguide having an independent entire length different from the others, each of the waveguides having an active segment, each of the active segments being doped with an amplifying dopant, and each active segment independently having a different length based on balancing losses due to the independent entire lengths of the waveguides;
an amplification node, each active segment of the waveguides going through the amplification node; and
an amplification module comprising a pump source comprising plural light sources arranged to provide independently controllable levels of pump radiation to the active segments of the waveguides at the amplification node.

28. The optical printed circuit board according to claim 27, wherein the losses are further due to the number of bends in the polymer waveguide, the angles subtended by given bends in the polymer waveguide, bend radii, refractive index between core and cladding, number of crossings, crossing angles, side wall roughness, or combinations thereof.

* * * * *